(12) United States Patent
Chen et al.

(10) Patent No.: US 11,894,331 B2
(45) Date of Patent: Feb. 6, 2024

(54) CHIP PACKAGE STRUCTURE, CHIP STRUCTURE AND METHOD FOR FORMING CHIP STRUCTURE

(71) Applicant: Taiwan Semiconductor Manufacturing Company, Ltd., Hsinchu (TW)

(72) Inventors: Chien-Cheng Chen, Hsinchu County (TW); Pei-Haw Tsao, Tai-chung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 172 days.

(21) Appl. No.: 17/460,908

(22) Filed: Aug. 30, 2021

(65) Prior Publication Data

US 2023/0060457 A1    Mar. 2, 2023

(51) Int. Cl.
*H01L 23/00* (2006.01)

(52) U.S. Cl.
CPC .............. *H01L 24/13* (2013.01); *H01L 24/05* (2013.01); *H01L 24/11* (2013.01); *H01L 24/16* (2013.01); *H01L 2224/022* (2013.01); *H01L 2224/0401* (2013.01); *H01L 2224/11831* (2013.01); *H01L 2224/13018* (2013.01); *H01L 2224/13084* (2013.01); *H01L 2224/16227* (2013.01)

(58) Field of Classification Search
CPC ......... H01L 24/13; H01L 24/05; H01L 24/11; H01L 24/16; H01L 2224/022; H01L 2224/0401; H01L 2224/11831; H01L 2224/13018; H01L 2224/13084; H01L 2224/16227; H01L 2224/11; H01L 2224/13017; H01L 2224/16225; H01L 2224/32225; H01L 2224/73204
See application file for complete search history.

(56) References Cited

U.S. PATENT DOCUMENTS

| | | | |
|---|---|---|---|
| 2005/0127508 A1* | 6/2005 | Lee | H01L 24/13 257/737 |
| 2008/0257595 A1* | 10/2008 | Hu | H01L 24/11 29/846 |
| 2011/0156256 A1* | 6/2011 | Kang | H01L 24/05 438/653 |
| 2012/0248599 A1 | 10/2012 | Ring | |
| 2015/0279890 A1* | 10/2015 | Spartiotis | H01L 27/14636 257/428 |
| 2022/0028815 A1* | 1/2022 | Takaku | H01L 23/49838 |

FOREIGN PATENT DOCUMENTS

| | | | | |
|---|---|---|---|---|
| TW | 507300 B | 10/2002 | | |
| TW | 201203482 A1 | 1/2012 | | |
| WO | WO-2021131620 A1 * | 7/2021 | ............. | H01L 24/05 |

* cited by examiner

Primary Examiner — Douglas W Owens
(74) Attorney, Agent, or Firm — Birch, Stewart, Kolasch & Birch, LLP

(57) ABSTRACT

A chip structure is provided. The chip structure includes a substrate. The chip structure includes an interconnect layer over the substrate. The chip structure includes a conductive pad over the interconnect layer. The chip structure includes a conductive bump over the conductive pad. The conductive bump has a first portion, a second portion, and a neck portion between the first portion and the second portion. The first portion is between the neck portion and the conductive pad. The neck portion is narrower than the first portion and narrower than the second portion.

20 Claims, 31 Drawing Sheets

CHIP PACKAGE STRUCTURE, CHIP STRUCTURE AND METHOD FOR FORMING CHIP STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is an enlarged view of a region X of the structure of FIG. 1A, in accordance with some embodiments.

FIG. 1B-1 is an enlarged view of a region X of the structure of FIG. 1B, in accordance with some embodiments.

FIG. 1C-1 is an enlarged view of a region X of the structure of FIG. 1C, in accordance with some embodiments.

FIG. 2A-1 is an enlarged view of a region X of the structure of FIG. 2A, in accordance with some embodiments.

FIG. 2B-1 is an enlarged view of a region X of the structure of FIG. 2B, in accordance with some embodiments.

FIG. 2C-1 is an enlarged view of a region X of the structure of FIG. 2C, in accordance with some embodiments.

FIG. 3A-1 is an enlarged view of a region X of the structure of FIG. 3A, in accordance with some embodiments.

FIG. 3B-1 is an enlarged view of a region X of the structure of FIG. 3B, in accordance with some embodiments.

FIG. 3C-1 is an enlarged view of a region X of the structure of FIG. 3C, in accordance with some embodiments.

DETAILED DESCRIPTION

Figure 1A:
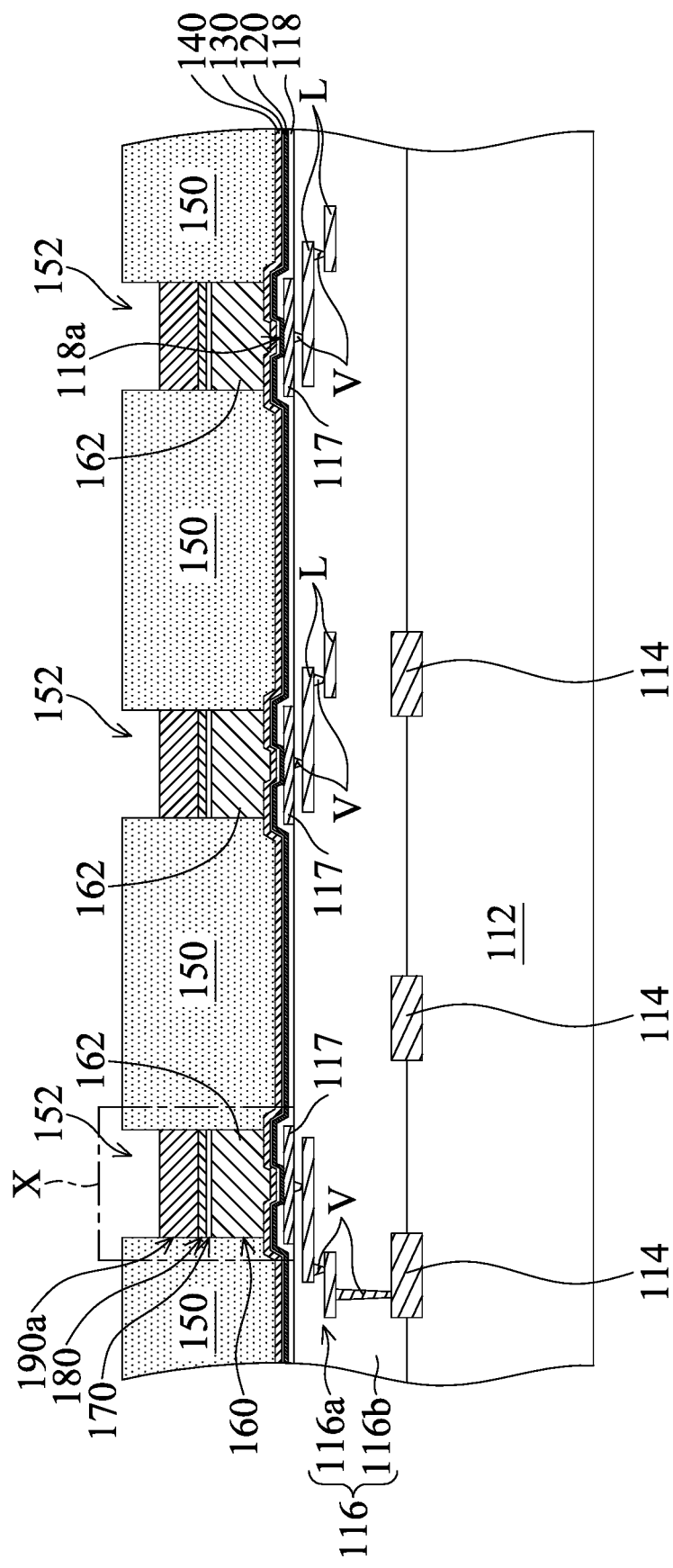
FIGS. 1A-1F are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1F are cross-sectional views of various stages of a process for forming a chip package structure, in accordance with some embodiments. As shown in FIG. 1A, a substrate 112 is provided, in accordance with some embodiments. The substrate 112 includes, for example, a semiconductor substrate. The substrate 112 includes, for example, a semiconductor wafer (such as a silicon wafer) or a portion of a semiconductor wafer.

In some embodiments, the substrate 112 is made of an elementary semiconductor material including silicon or germanium in a single crystal structure, a polycrystal structure, or an amorphous structure. In some other embodiments, the substrate 112 is made of a compound semiconductor, such as silicon carbide, gallium arsenide, gallium phosphide, indium phosphide, indium arsenide, an alloy semiconductor, such as SiGe or GaAsP, or a combination thereof. The substrate 112 may also include multi-layer semiconductors, semiconductor on insulator (SOI) (such as silicon on insulator or germanium on insulator), or a combination thereof.

In some embodiments, various devices 114 are formed in and/or over the substrate 112. Examples of the various devices 114 include active devices, passive devices, other suitable devices, or a combination thereof. The active devices may include transistors or diodes formed at a surface of the substrate 112. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various devices 114. The FEOL semiconductor fabrication processes may include deposition, etching, implantation, photolithography, annealing, planarization, one or more other applicable processes, or a combination thereof.

In some embodiments, isolation features (not shown) are formed in the substrate 112. The isolation features are used to surround active regions and electrically isolate various devices 114 formed in and/or over the substrate 112 in the active regions. In some embodiments, the isolation features include shallow trench isolation (STI) features, local oxidation of silicon (LOCOS) features, other suitable isolation features, or a combination thereof.

As shown in FIG. 1A, an interconnect layer 116 is formed over the substrate 112 and covers the devices 114, in accordance with some embodiments. As shown in FIG. 1A, conductive pads 117 are formed over the interconnect layer 116, in accordance with some embodiments. The interconnect layer 116 includes an interconnect structure 116a and a dielectric layer 116b, in accordance with some embodiments. The interconnect structure 116a is in the dielectric layer 116b, in accordance with some embodiments.

The interconnect structure 116a includes wiring layers L and conductive vias V, in accordance with some embodiments. The conductive vias V are electrically connected between different wiring layers L, in accordance with some embodiments. The conductive vias V are electrically connected between the wiring layer L and the conductive pads 117, in accordance with some embodiments.

The conductive vias V are electrically connected between the wiring layer L and the devices 114, in accordance with some embodiments. The wiring layers L, the conductive vias V, and the conductive pads 117 are made of a conductive material, such as metal (e.g., aluminum, copper, silver, gold, nickel, or tungsten) or alloys thereof, in accordance with some embodiments. The dielectric layer 116b is made of a dielectric material, such as silicon oxide, silicon nitride, un-doped silicate glass (USG), or another suitable material, in accordance with some embodiments.

Figures 1, 1A:
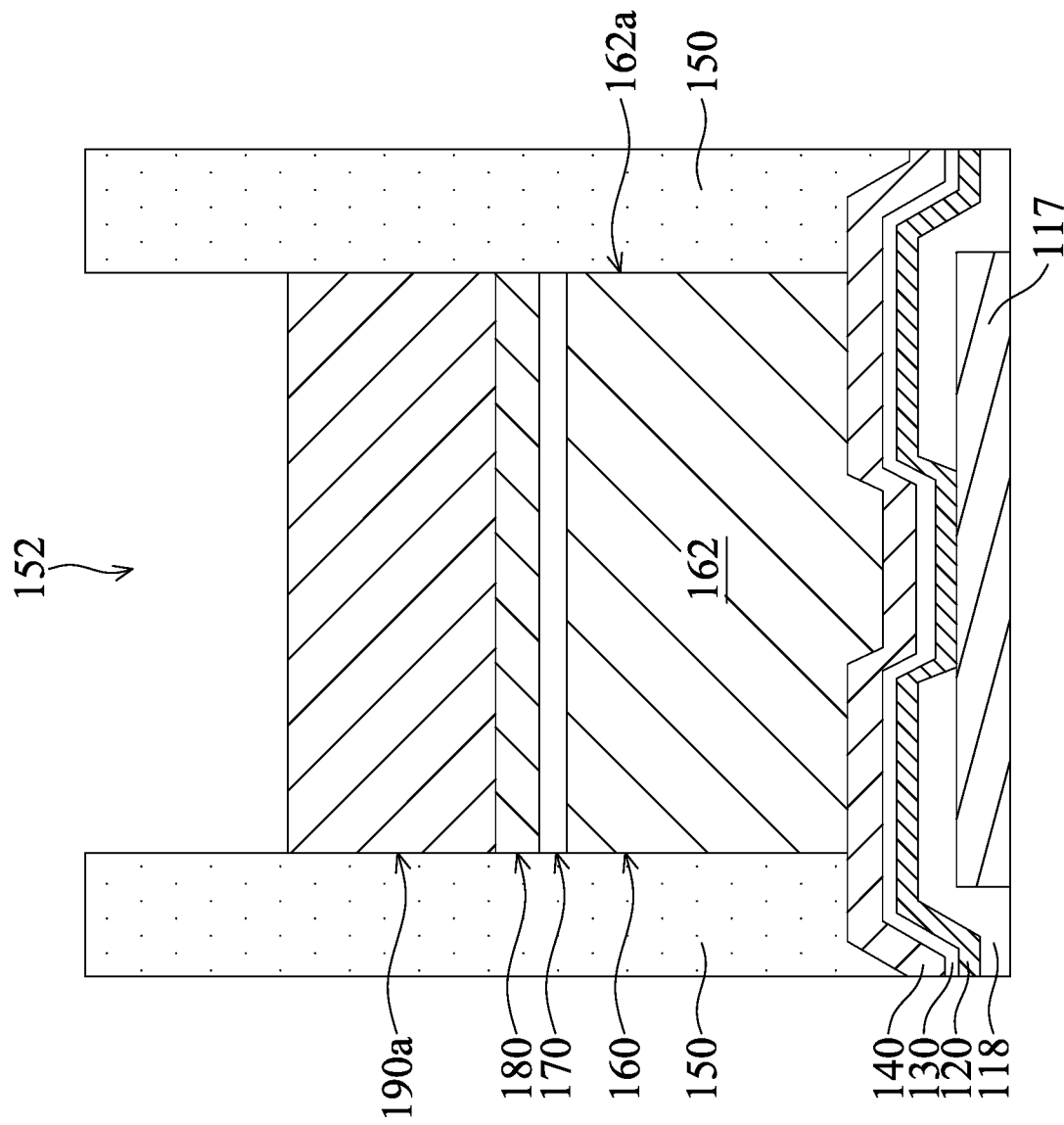

FIG. 1A-1 is an enlarged view of a region X of the structure of FIG. 1A, in accordance with some embodiments. As shown in FIGS. 1A and 1A-1, a passivation layer 118 is formed over the interconnect layer 116 to cover edge portions of the conductive pads 117, in accordance with some embodiments. The passivation layer 118 has openings 118a partially exposing the conductive pads 117, in accordance with some embodiments. The passivation layer 118 is made of a dielectric material, such as polyimide, silicon oxide, silicon nitride, un-doped silicate glass (USG), or another suitable material, in accordance with some embodiments.

As shown in FIGS. 1A and 1A-1, a seed layer 120 is conformally formed over the passivation layer 118 and the conductive pads 117, in accordance with some embodiments. The materials of the seed layer 120 include titanium or the like, in accordance with some embodiments. The seed layer 120 is formed using a physical vapor deposition (PVD) process such as a sputtering process, in accordance with some embodiments.

As shown in FIGS. 1A and 1A-1, an alloy layer 130 and a seed layer 140 are sequentially formed over the seed layer 120, in accordance with some embodiments. The alloy layer 130 conformally covers the seed layer 120, in accordance with some embodiments. The seed layer 140 conformally covers the alloy layer 130, in accordance with some embodiments. The alloy layer 130 and the seed layer 140 are formed using a physical vapor deposition (PVD) process such as a sputtering process, in accordance with some embodiments.

The seed layer 140 includes copper or the like, in accordance with some embodiments. During the sputtering process for forming the alloy layer 130 and the seed layer 140, the sputtered copper tends to bond with titanium in the seed layer 120, which forms a copper-titanium alloy layer (i.e., the alloy layer 130) over the seed layer 120 firstly and then forms the seed layer 140 over the alloy layer 130, in accordance with some embodiments. Therefore, the alloy layer 130 is also referred to as a transition layer between the seed layers 120 and 140, in accordance with some embodiments. The alloy layer 130 includes the materials of the seed layers 120 and 140, in accordance with some embodiments.

As shown in FIGS. 1A and 1A-1, a mask layer 150 is formed over the seed layer 140, in accordance with some embodiments. The mask layer 150 has openings 152, in accordance with some embodiments. The openings 152 partially expose the seed layer 140 over the conductive pads 117, in accordance with some embodiments. The mask layer 150 is made of a polymer material such as a photoresist material, in accordance with some embodiments.

As shown in FIGS. 1A and 1A-1, a conductive layer 160 is formed in the openings 152, in accordance with some embodiments. The conductive layer 160 in each opening 152 forms a conductive bump 162, in accordance with some embodiments. Each conductive bump 162 has sidewalls 162a, in accordance with some embodiments. The sidewalls 162a are planar surfaces, in accordance with some embodiments.

In some embodiments, the conductive layer 160 is made of a conductive material such as copper (Cu), an alloy thereof, or the combination thereof, in accordance with some embodiments. In some embodiments, the conductive layer 160, the seed layer 140, and the alloy layer 130 include the same metal element, such as copper. The conductive layer 160 is formed using an electroplating process, in accordance with some embodiments.

As shown in FIGS. 1A and 1A-1, an alloy layer 170 and a support layer 180 are sequentially formed over the conductive layer 160, in accordance with some embodiments. The alloy layer 170 and the support layer 180 are formed using an electroplating process, in accordance with some embodiments. In some embodiments, the support layer 180 is made of a conductive material such as nickel (Ni), palladium (Pd), gold (Au), or the like, in accordance with some embodiments.

During the electroplating process for forming the alloy layer 170 and the support layer 180, the conductive material (e.g., Ni, Pd, or Au) for forming the support layer 180 tends to bond with copper in the conductive layer 160, which forms the alloy layer 170 (e.g., a copper-nickel alloy layer, a copper-palladium alloy layer, or a copper-gold alloy layer) firstly and then forms the support layer 180 over the alloy layer 170, in accordance with some embodiments. Therefore, the alloy layer 170 is also referred to as a transition layer between the conductive layer 160 and the support layer 180, in accordance with some embodiments. The alloy layer 170 includes the materials of the conductive layer 160 and the support layer 180, in accordance with some embodiments.

The composition (e.g., copper) of the conductive layer 160 is different from the composition (e.g., copper and titanium) of the alloy layer 130, the composition (e.g., copper and nickel, palladium, or gold) of the alloy layer 170, and the composition (e.g., nickel, palladium, or gold) of the support layer 180, in accordance with some embodiments. The conductive layer 160, the alloy layers 130 and 170, and the seed layer 140 have the same metal element, such as copper, in accordance with some embodiments.

As shown in FIGS. 1A and 1A-1, a solder layer 190a is formed over the support layer 180, in accordance with some embodiments. The solder layer 190a is made of tin (Sn), the like, alloys thereof, or another suitable conductive material with a melting point lower than that of the conductive bumps 162, in accordance with some embodiments. The solder layer 190a is formed using a plating process such as an electroplating process, in accordance with some embodiments.

Figure 1B:
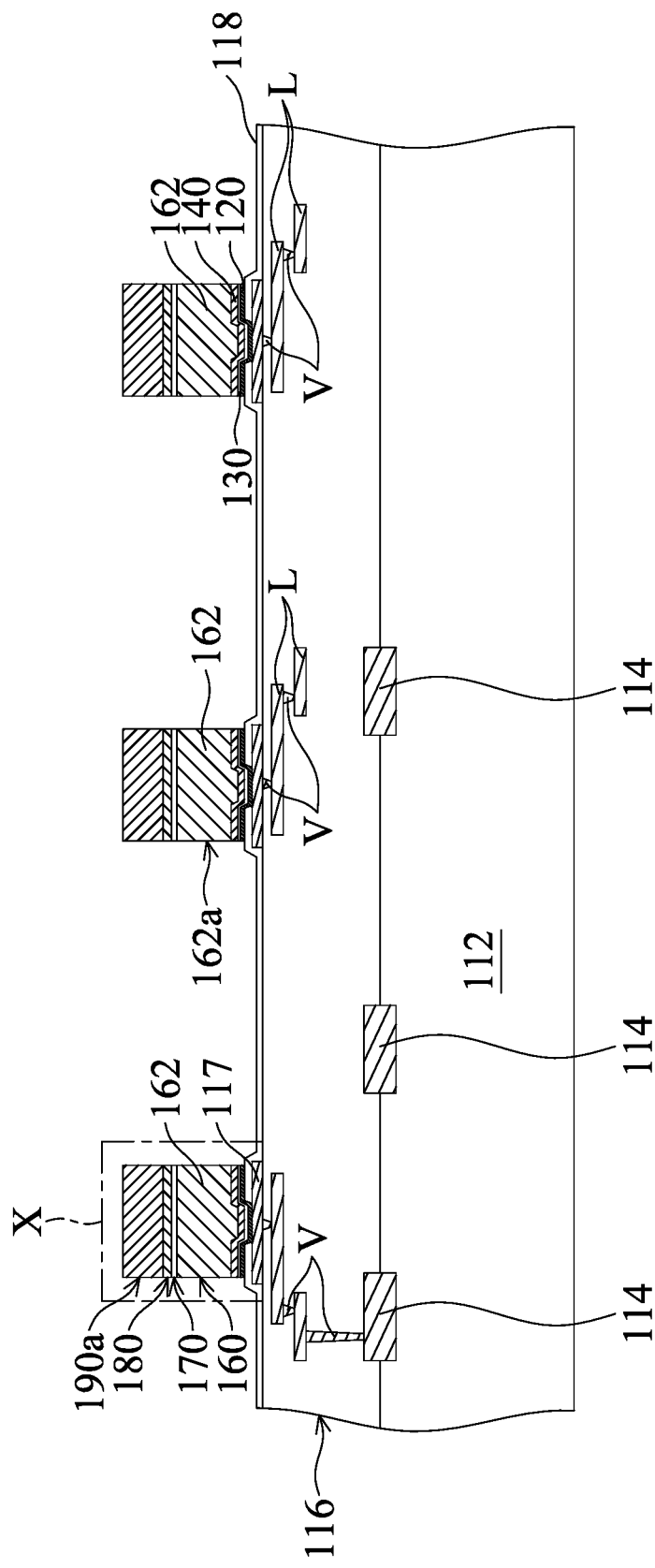
Figures 1, 1B:
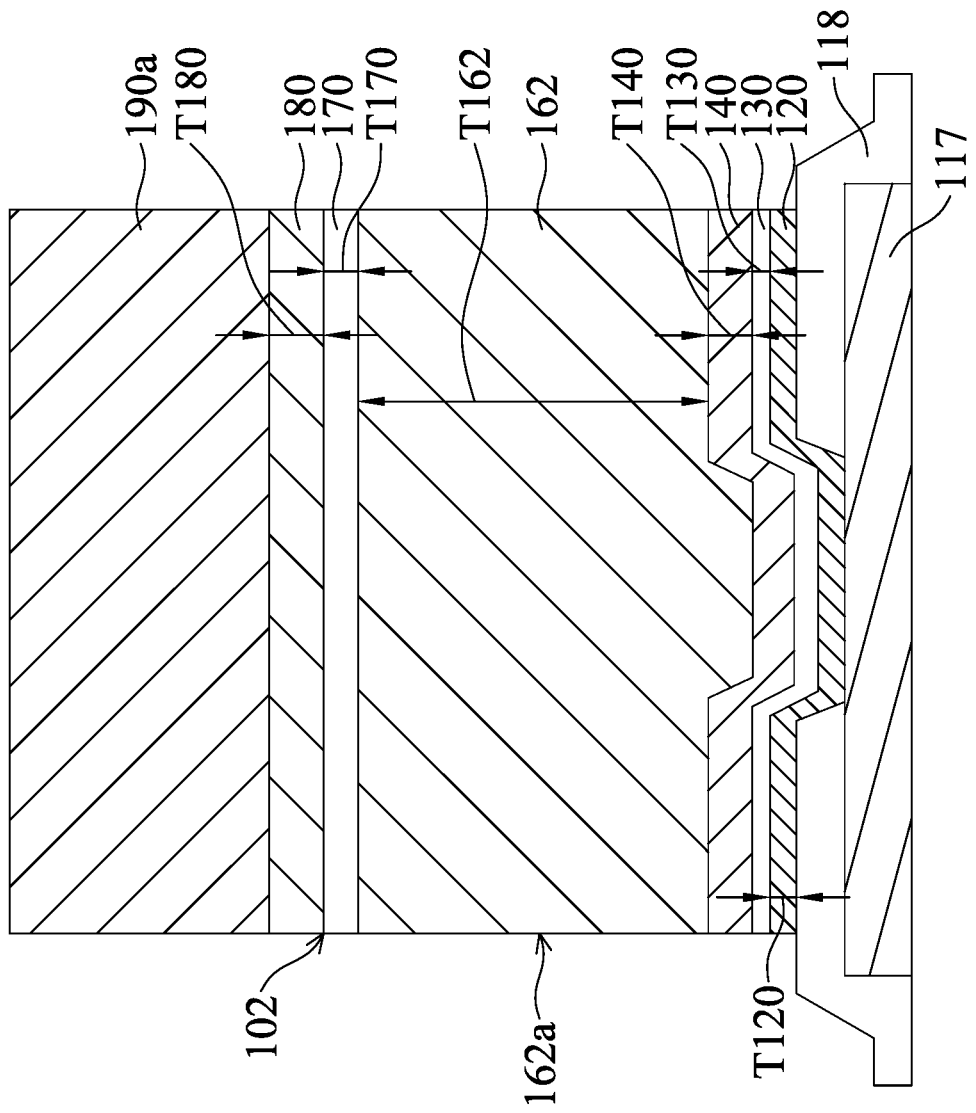

FIG. 1B-1 is an enlarged view of a region X of the structure of FIG. 1B, in accordance with some embodiments. As shown in FIGS. 1B and 1B-1, the mask layer 150 is removed, in accordance with some embodiments. The removal process includes an ash process and/or a flush process, in accordance with some embodiments.

Thereafter, as shown in FIGS. 1B and 1B-1, the seed layers 120 and 140 and the alloy layer 130 originally under the mask layer 150 are removed, in accordance with some embodiments. The removal process includes an etching process such as a dry etching process or a wet etching process, in accordance with some embodiments.

Each conductive bump 162, the alloy layer 130 and the seed layers 120 and 140 thereunder, and the alloy layer 170 thereover together form a conductive structure 102, in accordance with some embodiments. The conductive bump 162 is thicker than the alloy layers 130 and 170 and the seed layers 120 and 140, in accordance with some embodiments.

That is, a thickness T162 of the conductive bump 162 is greater than a thickness T170 of the alloy layer 170, a thickness T130 of the alloy layer 130, a thickness T120 of the seed layer 120, and a thickness T140 of the seed layer 140, in accordance with some embodiments. The thickness T162 is greater than a sum of the thicknesses T120, T130, T140, and T170, in accordance with some embodiments.

The thickness T162 ranges from about 20 µm to about 80 µm, in accordance with some embodiments. The thicknesses T120 ranges from about 0.1 µm to about 2 µm, in accordance with some embodiments. The thicknesses T130 ranges from about 0.5 µm to about 5 µm, in accordance with some embodiments.

The thicknesses T140 ranges from about 0.1 µm to about 2 µm, in accordance with some embodiments. The thickness T170 ranges from about 0.5 µm to about 5 µm, in accordance with some embodiments. In some embodiments, a thickness T180 of the support layer 180 ranges from about 1 µm to about 6 µm.

Figure 1C:
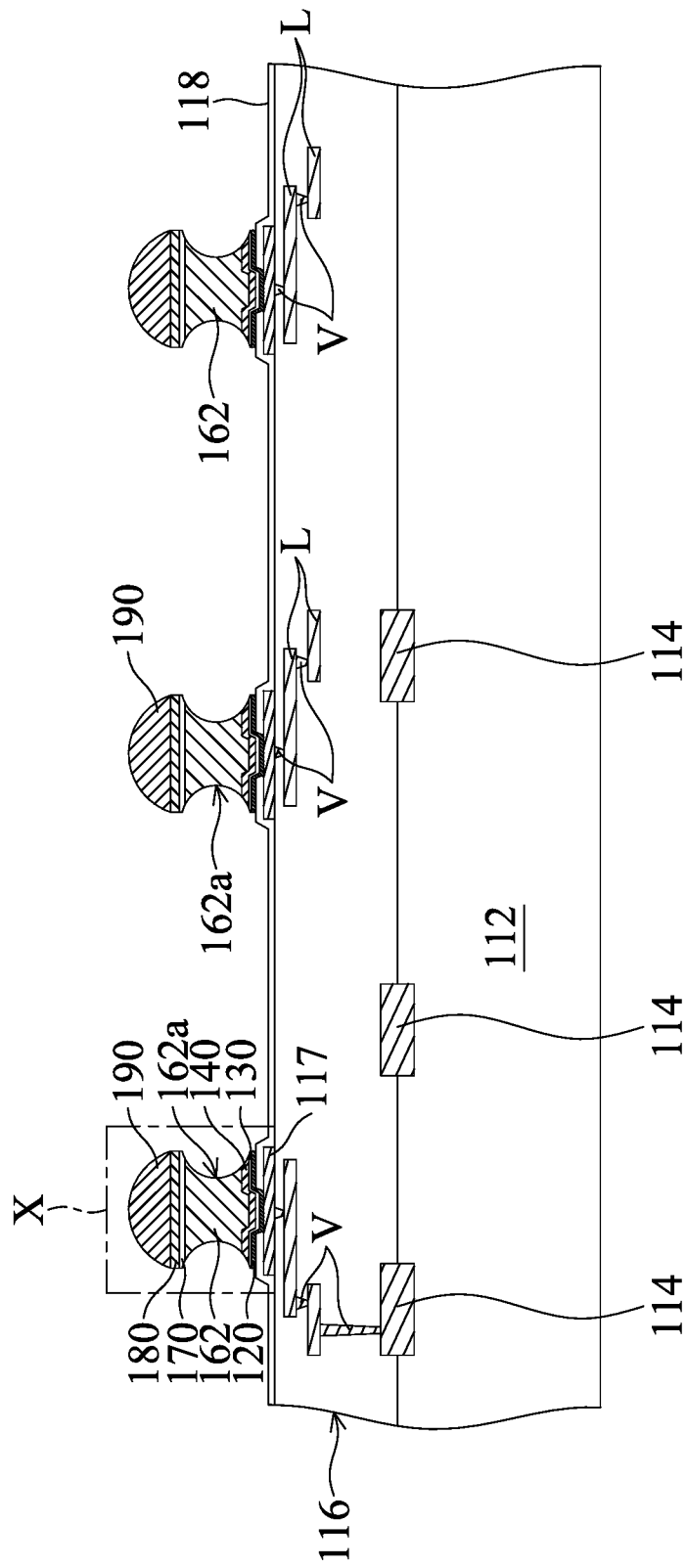
Figures 1, 1C:
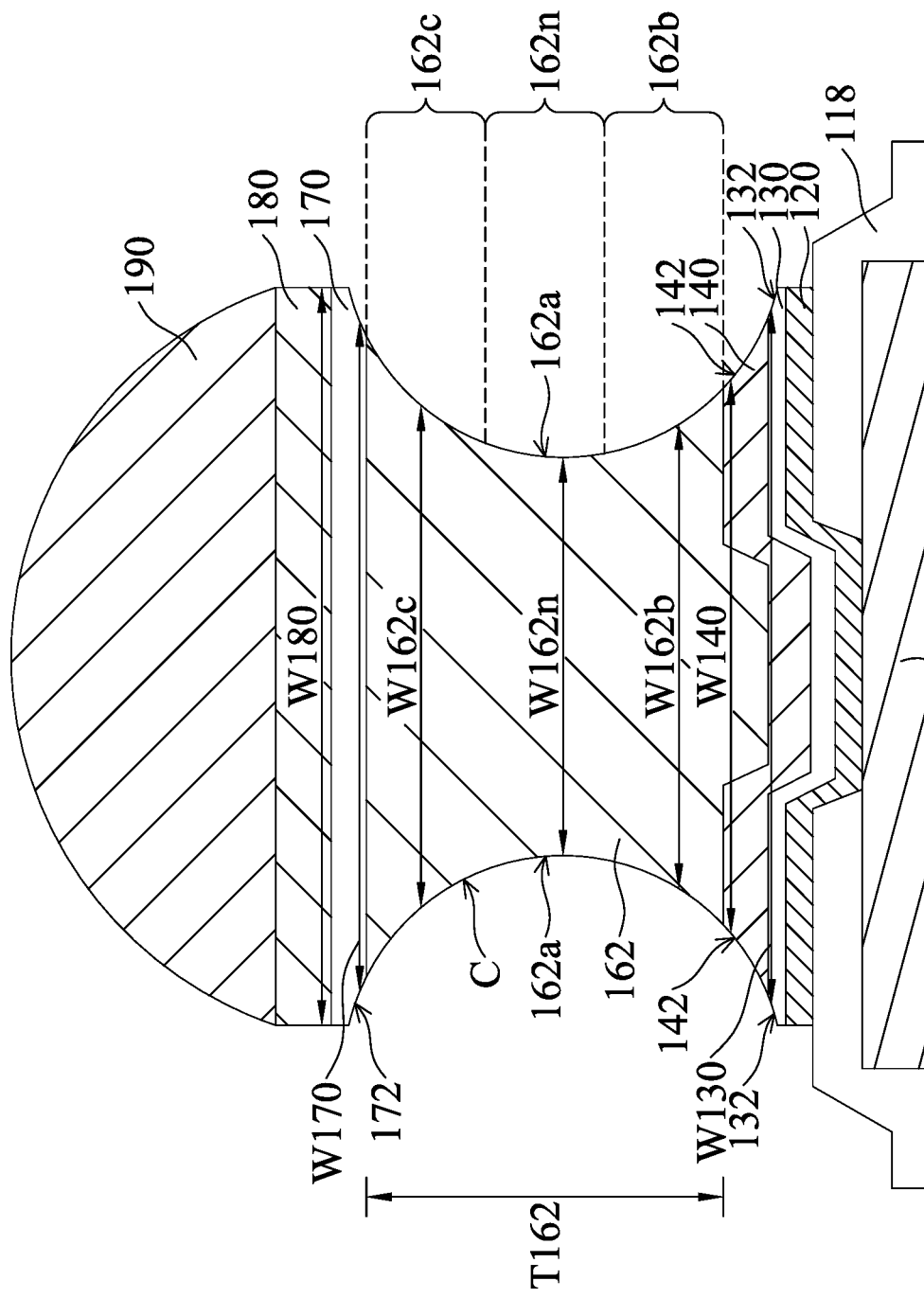

FIG. 1C-1 is an enlarged view of a region X of the structure of FIG. 1C, in accordance with some embodiments. As shown in FIGS. 1B, 1C and 1C-1, a selective etching process is performed to remove portions of the conductive bumps 162 from the sidewalls 162a of the conductive bumps 162 so as to narrow the conductive bumps 162, in accordance with some embodiments. After the selective etching process, the sidewalls 162a become concave sidewalls 162a, in accordance with some embodiments.

Each conductive bump 162 has a first portion 162b, a second portion 162c, and a neck portion 162n between the first portion 162b and the second portion 162c, in accordance with some embodiments. The first portion 162b has a width W162b decreasing toward the neck portion 162n, in accordance with some embodiments. The second portion 162c has a width W162c decreasing toward the neck portion 162n, in accordance with some embodiments.

The neck portion 162n is narrower than the first portion 162b and narrower than the second portion 162c, in accordance with some embodiments. That is, the average width of the neck portion 162n is narrower than the average width of the first portion 162b and narrower than the average width of the second portion 162c, in accordance with some embodiments. The neck portion 162n is also referred to as a waist portion, in accordance with some embodiments.

The support layer 180 is wider than the neck portion 162n, in accordance with some embodiments. That is, a width W180 of the support layer 180 is greater than the average width of the neck portion 162n, in accordance with some embodiments. In some embodiments, a ratio of the minimal width W162n of the neck portion 162n to the width W180 ranges from about 0.5 to about 0.95.

If the ratio (W162n/W180) is less than 0.5, the neck portion 162n is too thin to withstand the joint stress induced in the neck portions 162n in a subsequent bonding process, in accordance with some embodiments. If the ratio (W162n/W180) is greater than 0.95, the neck portion 162n is too thick to deform in a subsequent bonding process, which increases the joint stress induced in the neck portions 162*n* and therefore induces cracks in the neck portions 162*n*, in accordance with some embodiments.

In some embodiments, a ratio of the minimal width W162*n* of the neck portion 162*n* to the thickness T162 of the conductive bump 162 ranges from about 1 to about 2. If the ratio (W162*n*/T162) is less than 1, the neck portion 162*n* is too thin to withstand the joint stress induced in the neck portions 162*n* in a subsequent bonding process, in accordance with some embodiments. If the ratio (W162*n*/T162) is greater than 2, the neck portion 162*n* is too thick to deform in a subsequent bonding process, which increases the joint stress induced in the neck portions 162*n* and therefore induces cracks in the neck portions 162*n*, in accordance with some embodiments.

The minimal width W162*n* of the neck portion 162*n* ranges from about 40 μm to about 80 μm, in accordance with some embodiments. The width W180 of the support layer 180 ranges from about 40 μm to about 80 μm, in accordance with some embodiments.

Since the support layer 180 and the conductive bump 162 are made of different materials, the width W180 of the support layer 180 is able to be maintained after the selective etching process, in accordance with some embodiments. Therefore, the width W180 of the support layer 180 is able to correspond to the width of to-be-bonded pads of a wiring substrate, which is bonded with the conductive bump 162 in a subsequent process, in accordance with some embodiments.

The average width of the alloy layer 170 is greater than the average width of the neck portion 162*n*, in accordance with some embodiments. The average width of the seed layer 140 is greater than the average width of the neck portion 162*n*, in accordance with some embodiments. The average width of the alloy layer 130 is greater than the average width of the neck portion 162*n*, in accordance with some embodiments. The average width of the seed layer 120 is greater than the average width of the neck portion 162*n*, in accordance with some embodiments.

Since the seed layer 140 and the alloy layers 130 and 170 have the metal material (e.g., copper) of the conductive bump 162, the selective etching process further removes edge portions of the seed layer 140, upper edge portions of the alloy layer 130, and lower edge portions of the alloy layer 170.

After the selective etching process, the alloy layer 170 has sloped sidewalls 172, the seed layer 140 has sloped sidewalls 142, and the alloy layer 130 has sloped sidewalls 132, in accordance with some embodiments. The sidewalls 172, 162*a*, 142 and 132 are sequentially connected to each other, in accordance with some embodiments. The sidewalls 172, 162*a*, 142 and 132 are curved sidewalls, in accordance with some embodiments. The sidewalls 172, 162*a*, 142 and 132 together form a curved sidewall C, in accordance with some embodiments.

The alloy layer 130 surrounded by the sidewalls 132 has a width W130 decreasing toward the conductive bump 162, in accordance with some embodiments. The seed layer 140 surrounded by the sidewalls 142 has a width W140 decreasing toward the conductive bump 162, in accordance with some embodiments. The alloy layer 170 surrounded by the sidewalls 172 has a width W170 decreasing toward the conductive bump 162, in accordance with some embodiments.

The widths W130, W140, and W162*b* of the alloy layer 130, the seed layer 140, and the first portion 162*b* of the conductive bump 162 continuously decrease toward the neck portion 162*n* of the conductive bump 162, in accordance with some embodiments. The widths W170 and W162*c* of the alloy layer 170 and the second portion 162*c* of the conductive bump 162 continuously decrease toward the neck portion 162*n*, in accordance with some embodiments. Therefore, the joint stress induced in the neck portions 162*n* is able to be uniformly shared by the seed layer 140, the alloy layer 130, the seed layer 120, the alloy layer 170, and the support layer 180 in a subsequent bonding process, in accordance with some embodiments. As a result, the reliability of the conductive bumps 162 is improved, in accordance with some embodiments.

The selective etching process includes a wet etching process, in accordance with some embodiments. The etchant of the wet etching process includes an acid, such as sulfuric acid, phosphoric acid, or the like, in accordance with some embodiments. The selective etching process includes spraying an etching solution over the substrate, which is rotated, in accordance with some embodiments.

Since the middle portion of the conductive bump 162 has a higher probability of contact with the etching solution than the upper portion and the lower portion of the conductive bumps 162 in the selective etching process, the etching rate of the middle portion is greater than that of the upper portion and the lower portion, in accordance with some embodiments. Therefore, after the selective etching process, the middle portion is narrowed or thinned and becomes the neck portion 162*n*, in accordance with some embodiments. In the selective etching process, an etching selection ratio (or an etching rate ratio) of the conductive bumps 162 to the seed layer 140 or the alloy layer 130 or 170 ranges from about 2 to about 4, in accordance with some embodiments.

As shown in FIGS. 1C and 1C-1, a reflow process is performed over the solder layer 190*a* to convert the solder layer 190*a* into solder structures 190, in accordance with some embodiments. The solder structures 190 are also referred to as solder balls or solder bumps, in accordance with some embodiments.

Figure 1D:
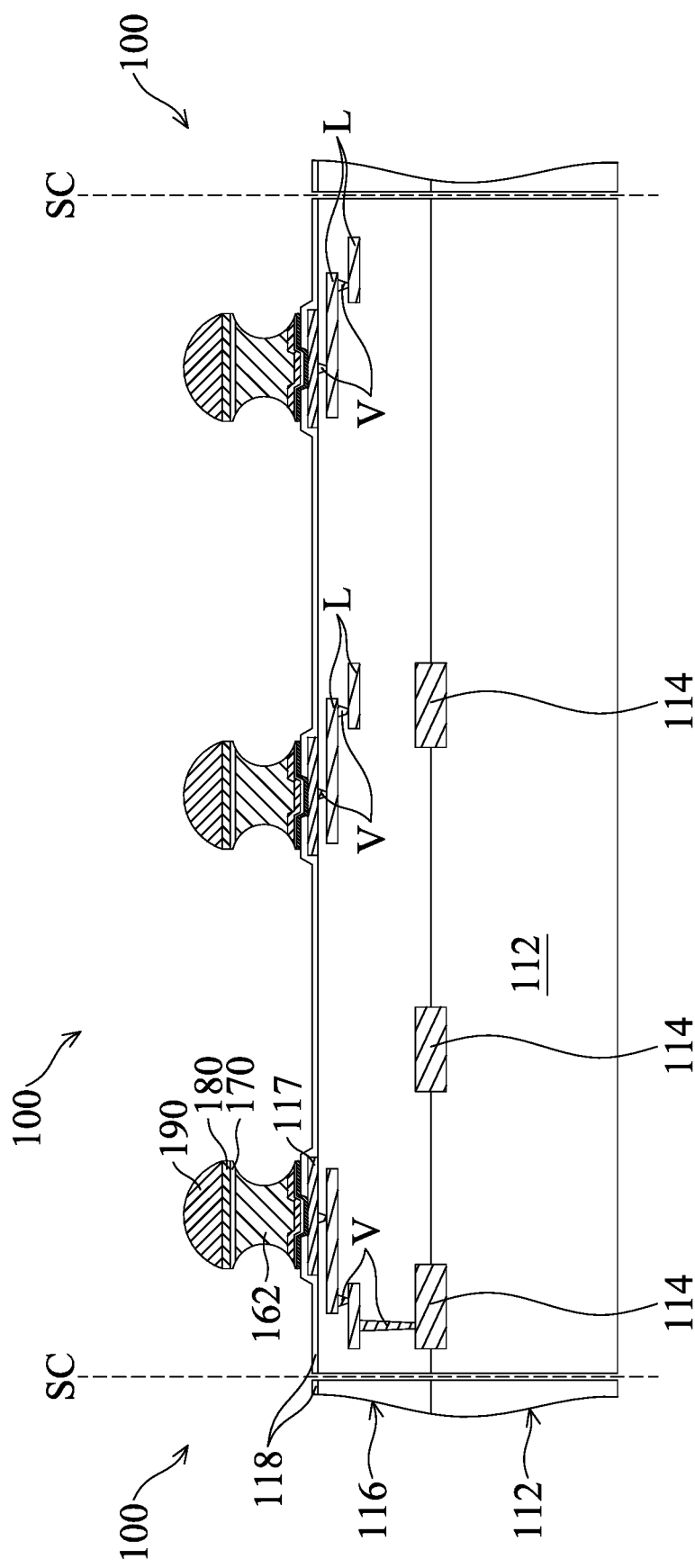

As shown in FIG. 1D, a cutting process is performed to cut through the passivation layer 118, the interconnect layer 116, and the substrate 112 along the predetermined scribe lines SC to form chip structures 100, in accordance with some embodiments.

Figure 1E:
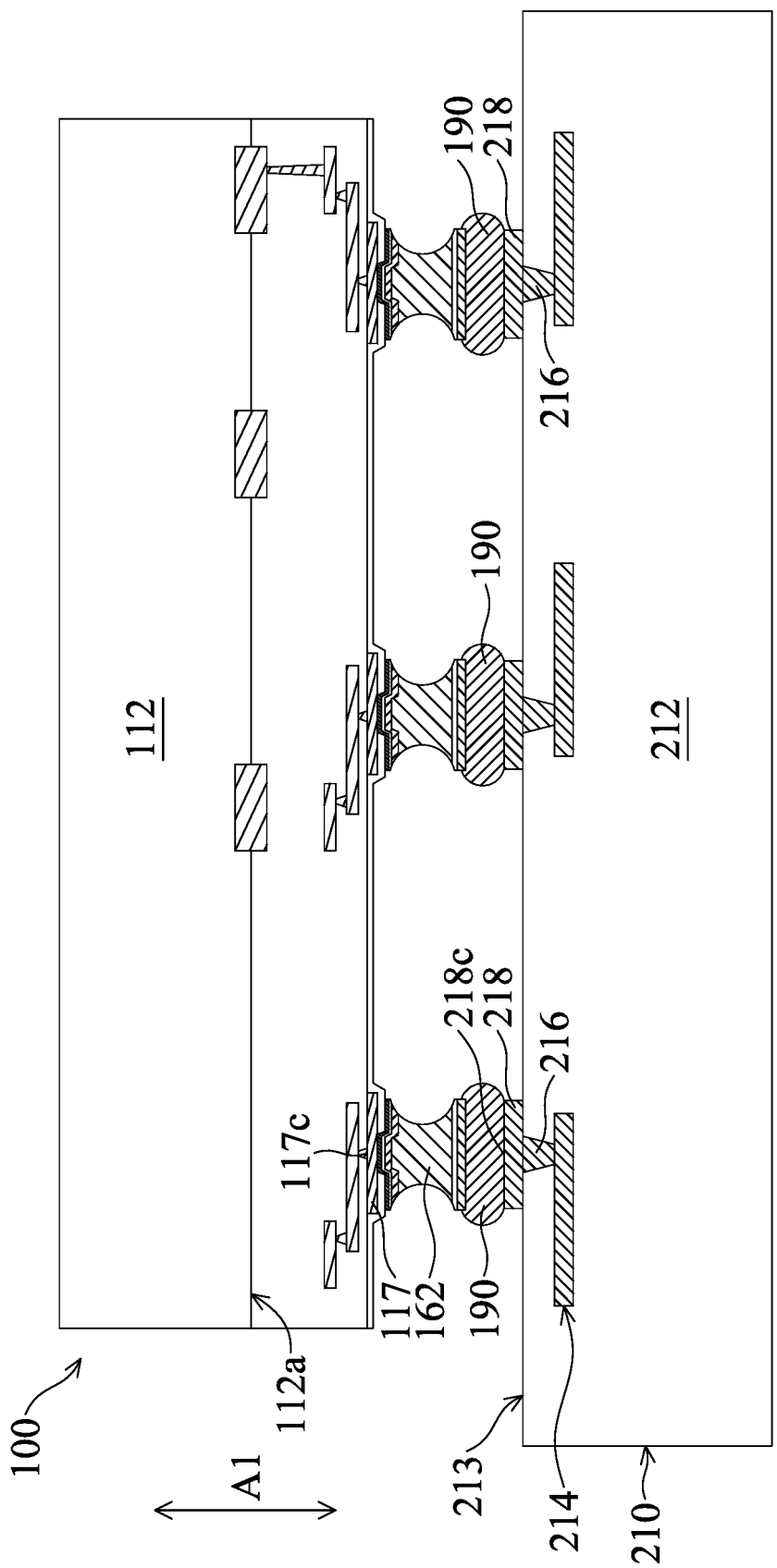

As shown in FIG. 1E, the chip structure 100 is bonded to a wiring substrate 210 through the solder structures 190 using an annealing process, in accordance with some embodiments. The process temperature of the annealing process ranges from about 200° C. to about 300° C., in accordance with some embodiments.

The wiring substrate 210 includes an insulating layer 212, wiring layers 214, conductive vias 216, and pads 218, in accordance with some embodiments. For the sake of simplicity, FIG. 1E shows one of the wiring layers 214, in accordance with some embodiments. The wiring layers 214 and the conductive vias 216 are formed in the insulating layer 212, in accordance with some embodiments.

The conductive pads 218 are formed over the insulating layer 212, in accordance with some embodiments. The solder structures 190 are bonded to the conductive pads 218 thereunder, in accordance with some embodiments. In some embodiments, a center portion 117*c* of the conductive pad 117 is aligned with a center portion 218*c* of the conductive pad 218, which is under the conductive pad 117, along an axis A1 perpendicular to a surface 112*a* of the substrate 112 and/or a surface 213 of the wiring substrate 210. The conductive vias 216 are electrically connected between different wiring layers 214 and between the wiring layers 214 and the conductive pads 218, in accordance with some embodiments.

The insulating layer 212 is made of a dielectric material, such as a polymer material (e.g., polyimide), glass fiber, silicon oxide, silicon nitride, un-doped silicate glass (USG), or another suitable material, in accordance with some embodiments. The wiring layers 214, conductive vias 216, and pads 218 are made of a conductive material, such as metal (e.g., aluminum, copper, silver, gold, nickel, or tungsten) or alloys thereof, in accordance with some embodiments.

Figure 1F:
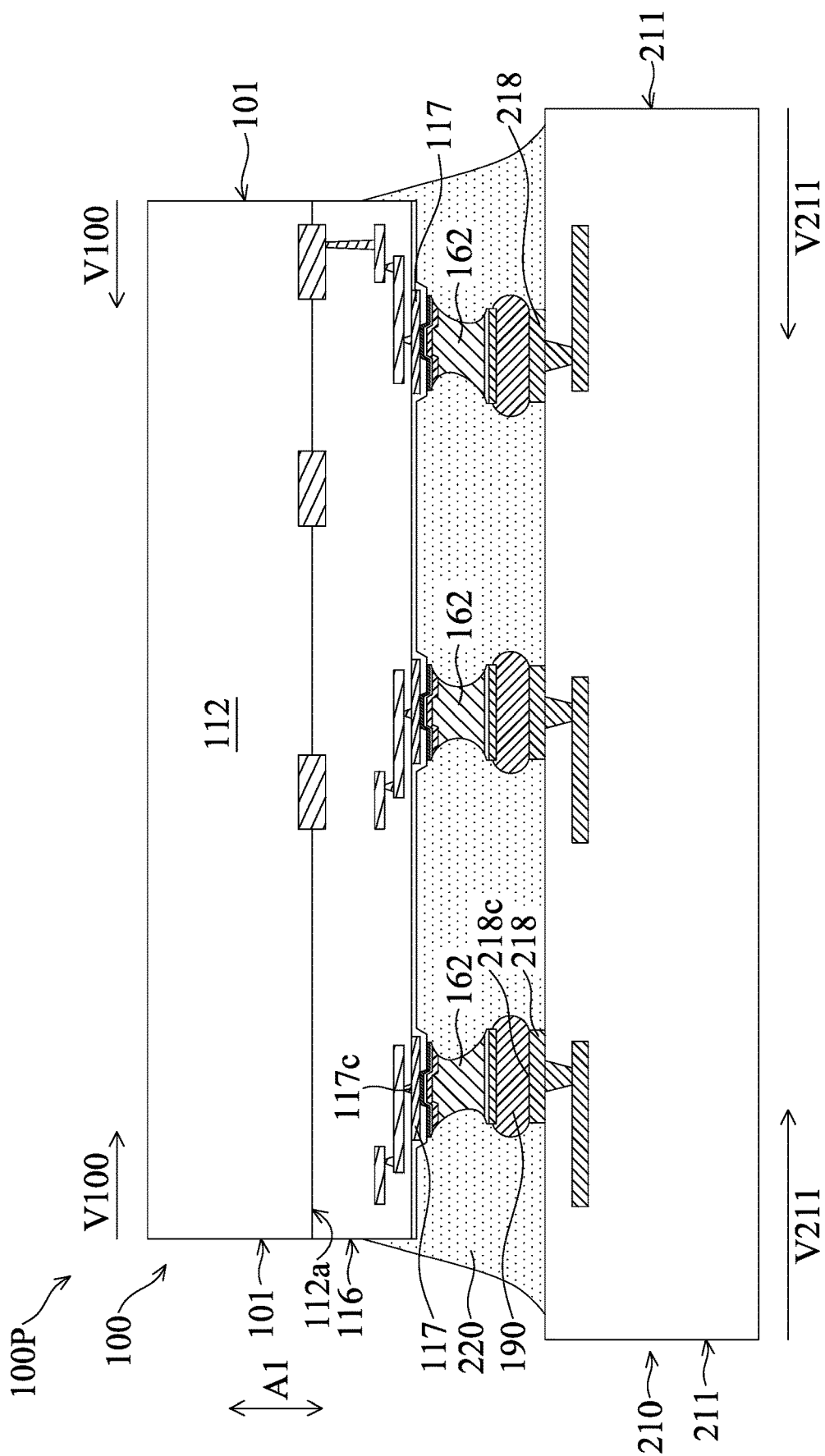

As shown in FIG. 1F, an underfill layer 220 is formed between the wiring substrate 210 and the chip structure 100, in accordance with some embodiments. The underfill layer 220 surrounds the chip structure 100, in accordance with some embodiments. Specifically, the underfill layer 220 surrounds the conductive bumps 162 and the solder structures 190, in accordance with some embodiments.

The underfill layer 220 is made of an insulating material, such as a polymer material, in accordance with some embodiments. In this step, a chip package structure 100P is substantially formed, in accordance with some embodiments.

As shown in FIG. 1F, the temperature of the chip structure 100 and the wiring substrate 210 are cooled to room temperature, and therefore the chip structure 100 and the wiring substrate 210 shrink, in accordance with some embodiments. The directions V100 represent the shrinkage directions of the sidewalls 101 of the chip structure 100, in accordance with some embodiments. The directions V211 represent the shrinkage directions of the sidewalls 211 of the wiring substrate 210, in accordance with some embodiments.

The coefficient of thermal expansion (CTE) of the wiring substrate 210 ranges from about 10 ppm/° C. to about 20 ppm/° C., in accordance with some embodiments. The CTE of the chip structure 100 ranges from about 1 ppm/° C. to about 5 ppm/° C., in accordance with some embodiments.

Since the CTE of the wiring substrate 210 is larger than that of the chip structure 100, the shrinkage of the wiring substrate 210 is larger than that of the chip structure 100, in accordance with some embodiments. Therefore, the center portion 117c of the conductive pad 117 is misaligned with the center portion 218c of the conductive pad 218 thereunder relative to the axis A1 after cooling the chip structure 100 and the wiring substrate 210, in accordance with some embodiments.

Since the conductive bumps 162 are narrowed in the step of FIG. 1C, the strength of the conductive bumps 162 against deformation is reduced, in accordance with some embodiments. That is, the narrowed conductive bumps 162 have greater flexibility or a lower spring constant, in accordance with some embodiments. Therefore, the joint stress caused by the CTE mismatch between the chip structure 100 and the wiring substrate 210 is reduced, in accordance with some embodiments. As a result, the reliability of the chip package structure 100P is improved, in accordance with some embodiments.

Figure 2A:
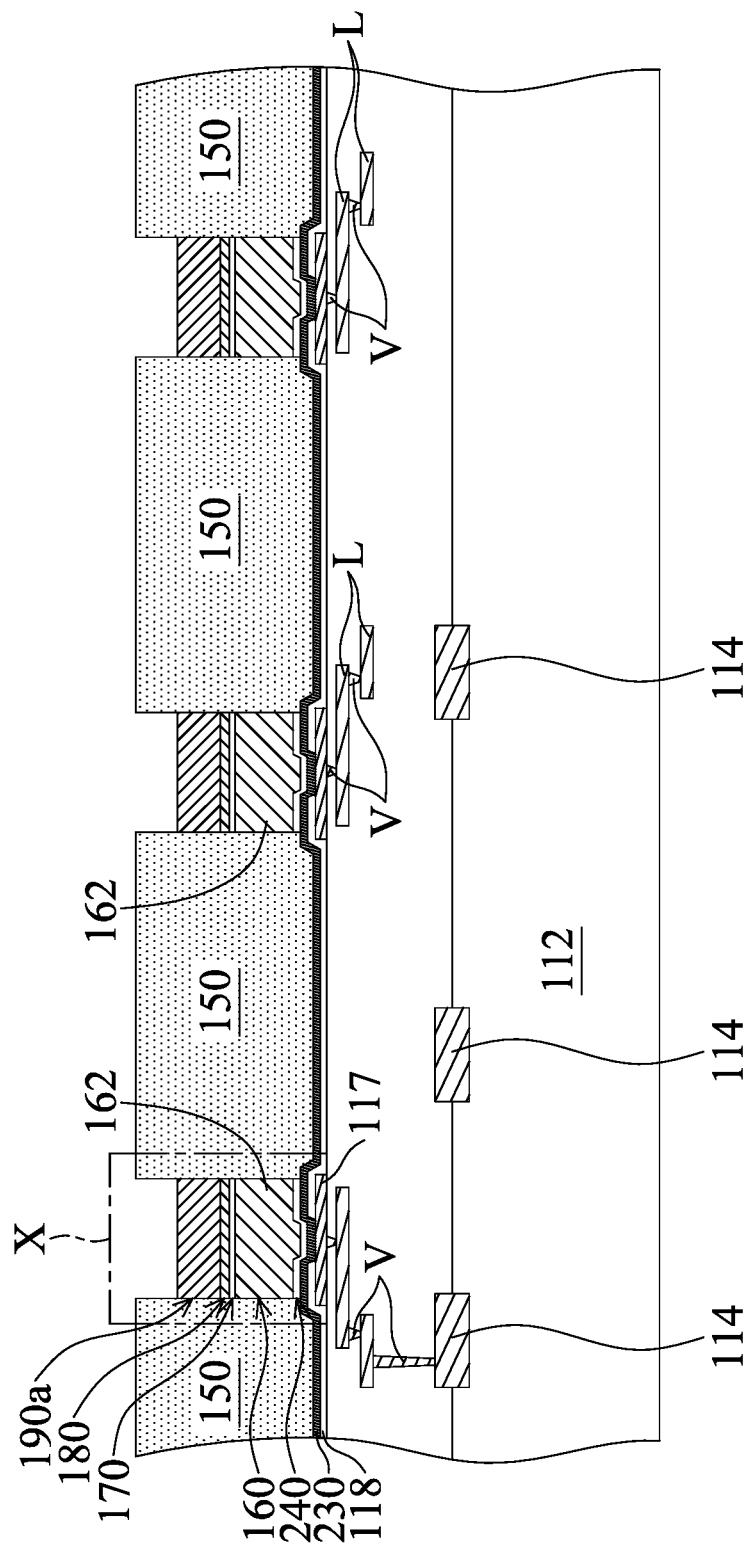
FIGS. 2A-2D are cross-sectional views of various stages of a process for forming a chip package structure, in accordance with some embodiments.
Figures 1, 2A:
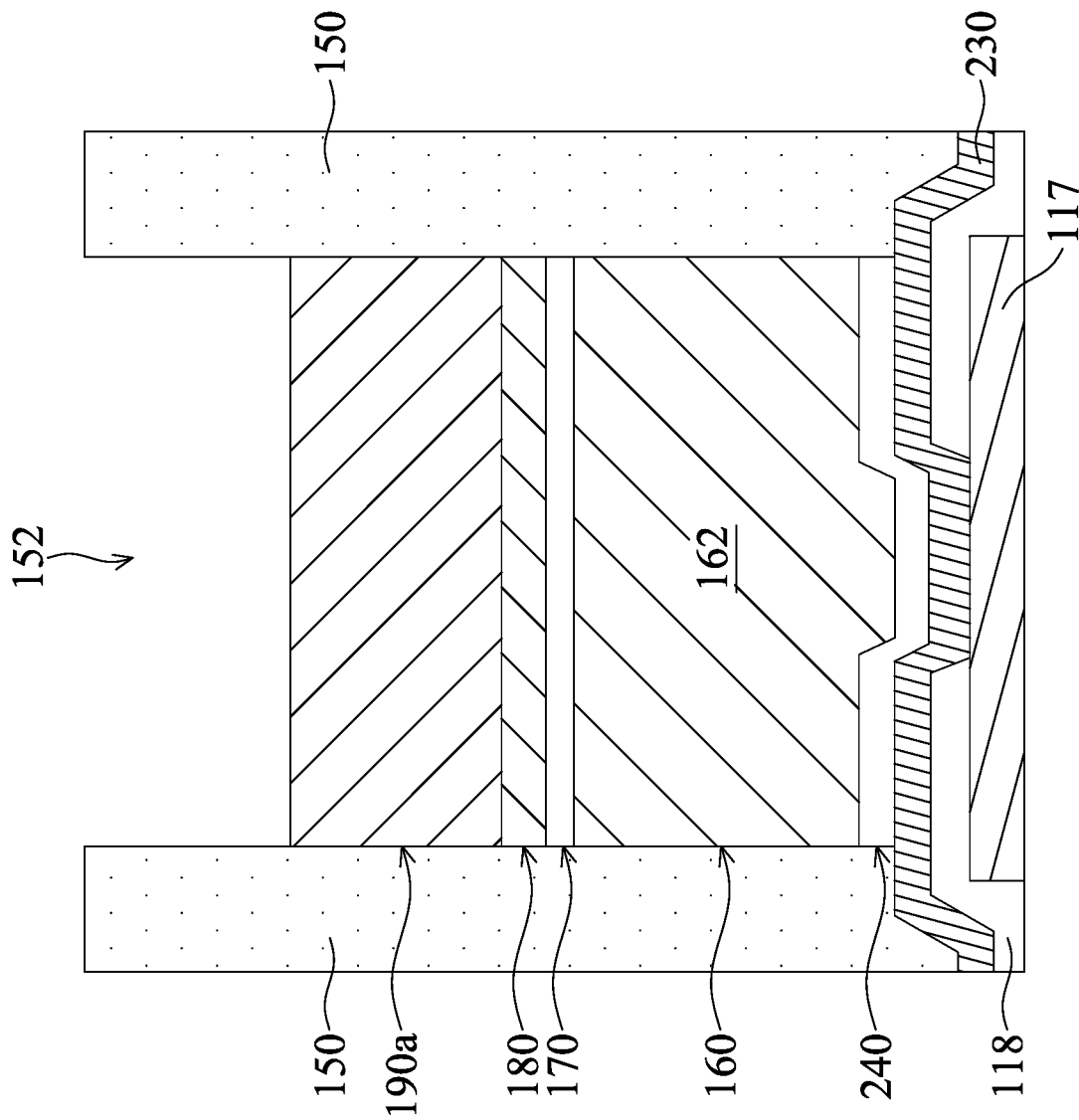

FIGS. 2A-2D are cross-sectional views of various stages of a process for forming a chip package structure, in accordance with some embodiments. FIG. 2A-1 is an enlarged view of a region X of the structure of FIG. 2A, in accordance with some embodiments.

After the formation of the passivation layer 118 of FIG. 1A, as shown in FIGS. 2A and 2A-1, a seed layer 230 is conformally formed over the passivation layer 118 and the conductive pads 117, in accordance with some embodiments. The materials of the seed layer 230 include an alloy, such as a titanium-tungsten alloy, in accordance with some embodiments. The seed layer 230 is formed using a physical vapor deposition (PVD) process such as a sputtering process, in accordance with some embodiments.

As shown in FIGS. 2A and 2A-1, a mask layer 150 is formed over the seed layer 230, in accordance with some embodiments. The mask layer 150 has openings 152, in accordance with some embodiments. The openings 152 partially expose the seed layer 230 over the conductive pads 117, in accordance with some embodiments.

As shown in FIGS. 2A and 2A-1, an alloy layer 240 and a conductive layer 160 are sequentially formed in the openings 152, in accordance with some embodiments. The conductive layer 160 in each opening 152 forms a conductive bump 162, in accordance with some embodiments.

The alloy layer 240 and the conductive layer 160 are formed using an electroplating process, in accordance with some embodiments. In some embodiments, the conductive layer 160 is made of a conductive material such as copper (Cu) or the like, in accordance with some embodiments.

During the electroplating process for forming the alloy layer 240 and the conductive layer 160, the conductive material (e.g., Cu) for forming the conductive layer 160 tends to bond with the titanium-tungsten alloy in the seed layer 230, which forms the alloy layer 240 (e.g., a copper-titanium-tungsten alloy layer) firstly and then forms the conductive layer 160 over the alloy layer 240, in accordance with some embodiments.

Therefore, the alloy layer 240 is also referred to as a transition layer between the conductive layer 160 and the seed layer 230, in accordance with some embodiments. The alloy layer 240 includes the materials of the conductive layer 160 and the seed layer 230, in accordance with some embodiments. The composition (e.g., copper) of the conductive layer 160 is different from the composition (e.g., copper, titanium, and tungsten) of the alloy layer 240, in accordance with some embodiments.

As shown in FIGS. 2A and 2A-1, an alloy layer 170, a support layer 180, and a solder layer 190a are sequentially formed over the conductive layer 160 using electroplating processes, in accordance with some embodiments.

Figure 2B:
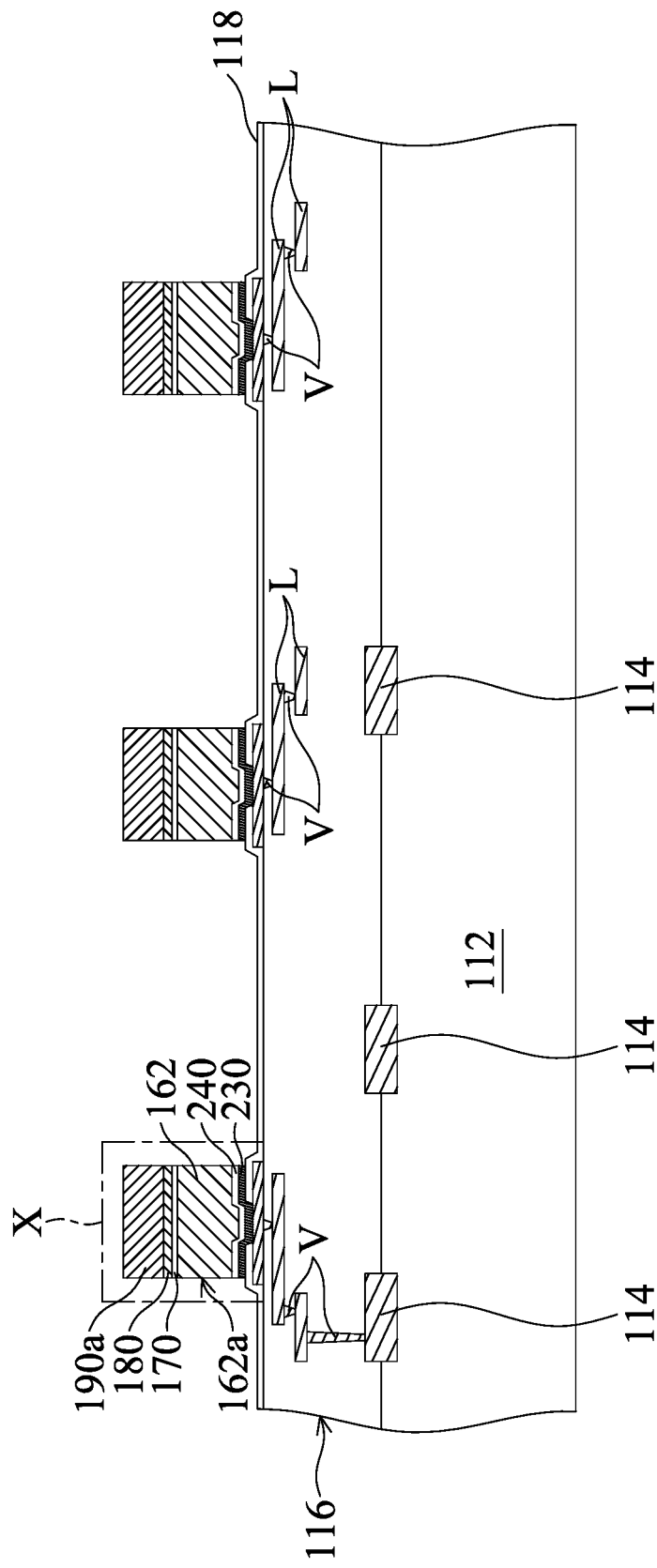
Figures 1, 2B:
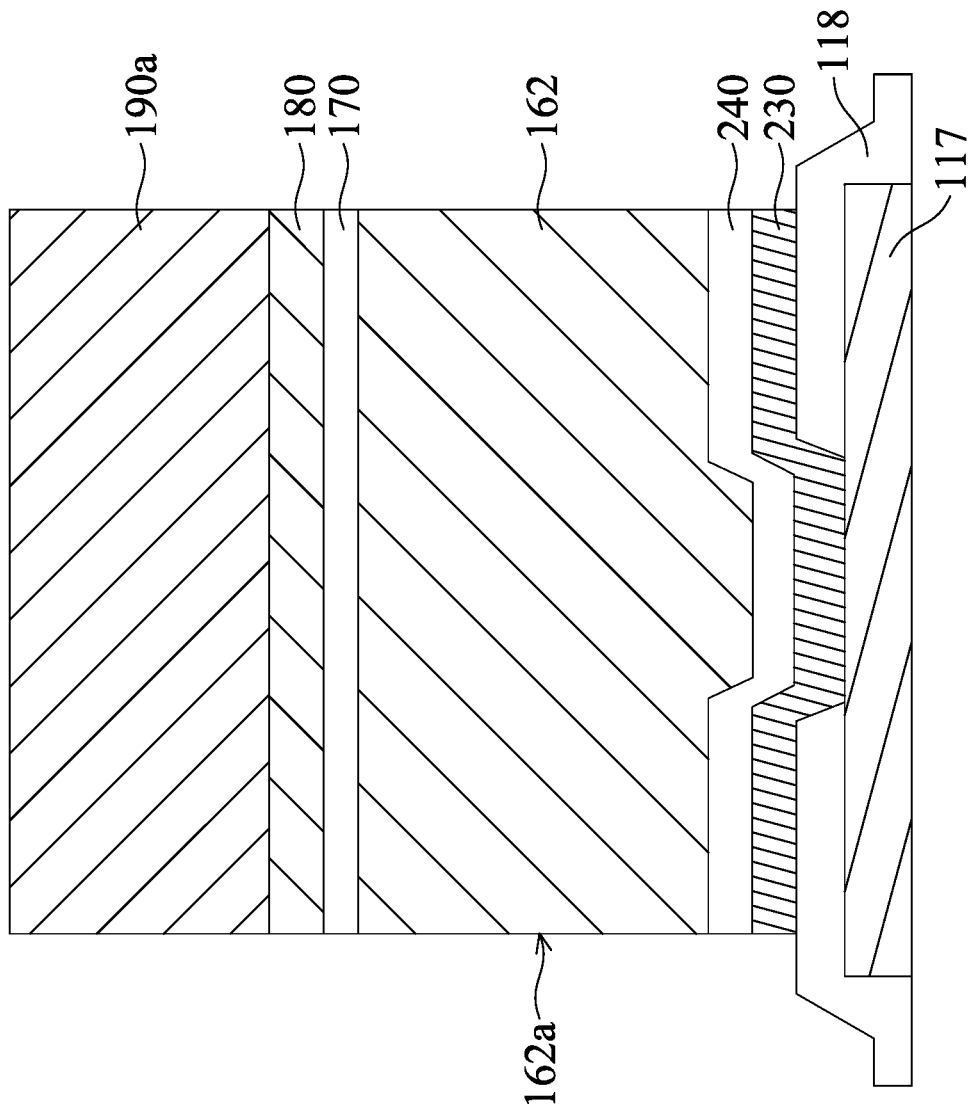

FIG. 2B-1 is an enlarged view of a region X of the structure of FIG. 2B, in accordance with some embodiments. As shown in FIGS. 2B and 2B-1, the mask layer 150 is removed, in accordance with some embodiments. As shown in FIGS. 2B and 2B-1, the seed layer 230 originally under the mask layer 150 is removed, in accordance with some embodiments.

Figure 2C:
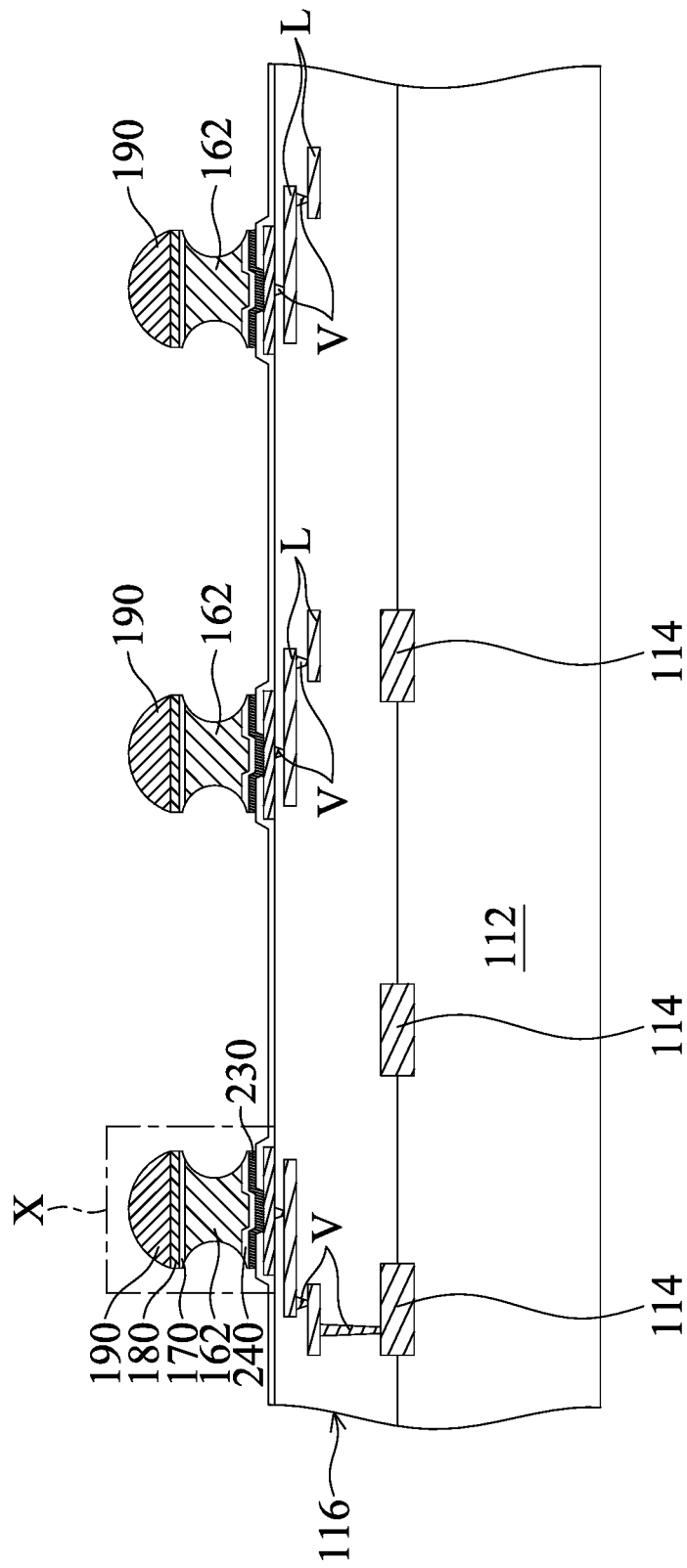
Figures 1, 2C:
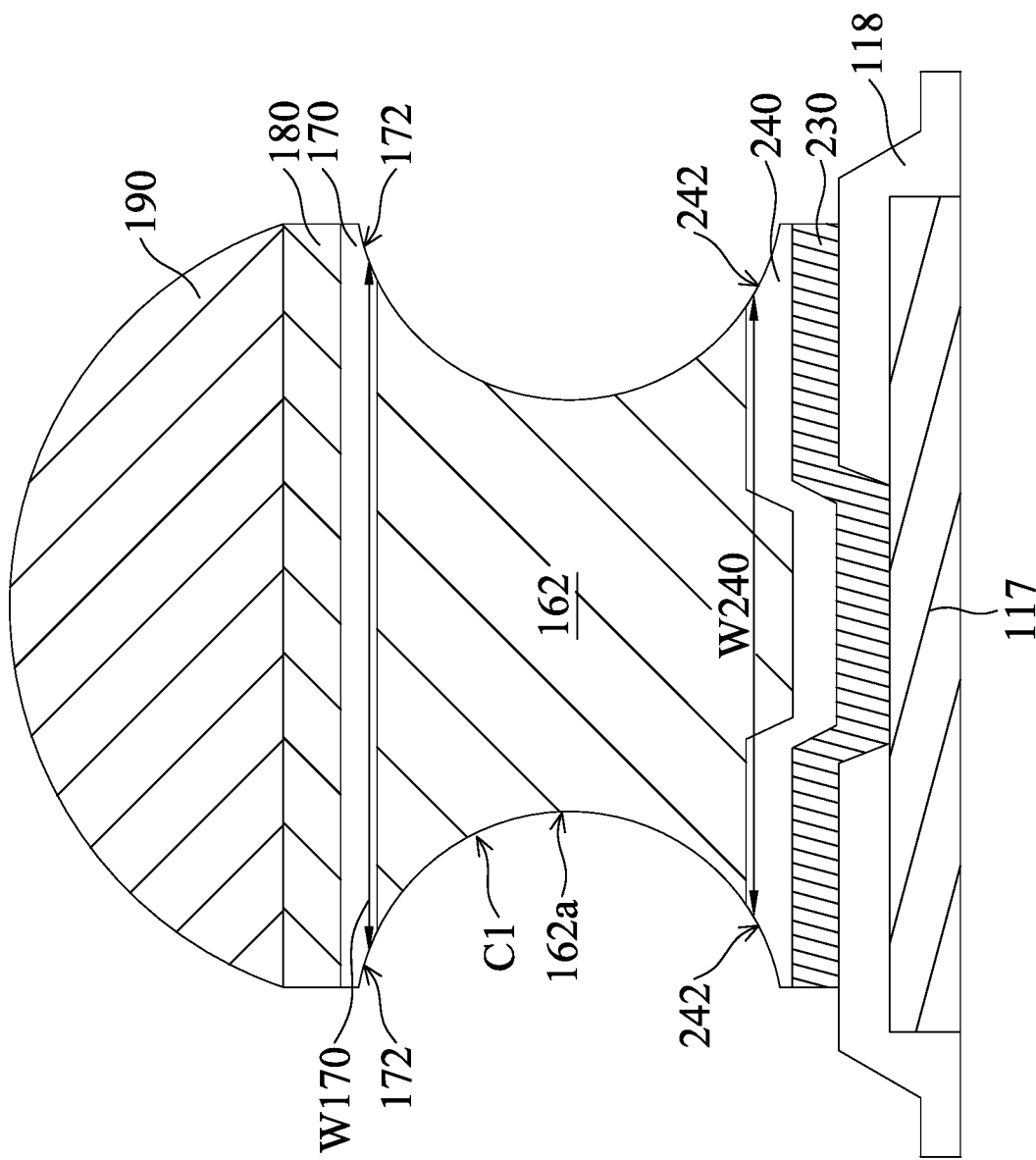

FIG. 2C-1 is an enlarged view of a region X of the structure of FIG. 2C, in accordance with some embodiments. As shown in FIGS. 2B, 2C and 2C-1, a selective etching process is performed to remove portions of the conductive bumps 162 from the sidewalls 162a of the conductive bumps 162 so as to narrow the conductive bumps 162, in accordance with some embodiments. After the selective etching process, the sidewalls 162a become concave sidewalls 162a, in accordance with some embodiments.

Since the alloy layers 170 and 240 have the metal material (e.g., copper) of the conductive bump 162, the selective etching process further removes upper edge portions of the alloy layer 240 and lower edge portions of the alloy layer 170. After the selective etching process, the alloy layer 170 has sloped sidewalls 172, and the alloy layer 240 has sloped sidewalls 242, in accordance with some embodiments. The sidewalls 172, 162a, and 242 are sequentially connected to each other, in accordance with some embodiments.

The sidewalls 172, 162a, and 242 are curved sidewalls, in accordance with some embodiments. The sidewalls 172, 162a, and 242 together form a curved sidewall C1, in accordance with some embodiments. The alloy layer 240 surrounded by the sidewalls 242 has a width W240 decreasing toward the conductive bump 162, in accordance with some embodiments.

The alloy layer 170 surrounded by the sidewalls 172 has a width W170 decreasing toward the conductive bump 162, in accordance with some embodiments. In the selective etching process, an etching selection ratio (or an etching rate ratio) of the conductive bumps 162 to the alloy layer 170 or 240 ranges from about 2 to about 4, in accordance with some embodiments.

As shown in FIGS. 2C and 2C-1, a reflow process is performed over the solder layer 190a to convert the solder layer 190a into solder structures 190, in accordance with some embodiments. The solder structures 190 are also referred to as solder balls or solder bumps, in accordance with some embodiments.

Figure 2D:
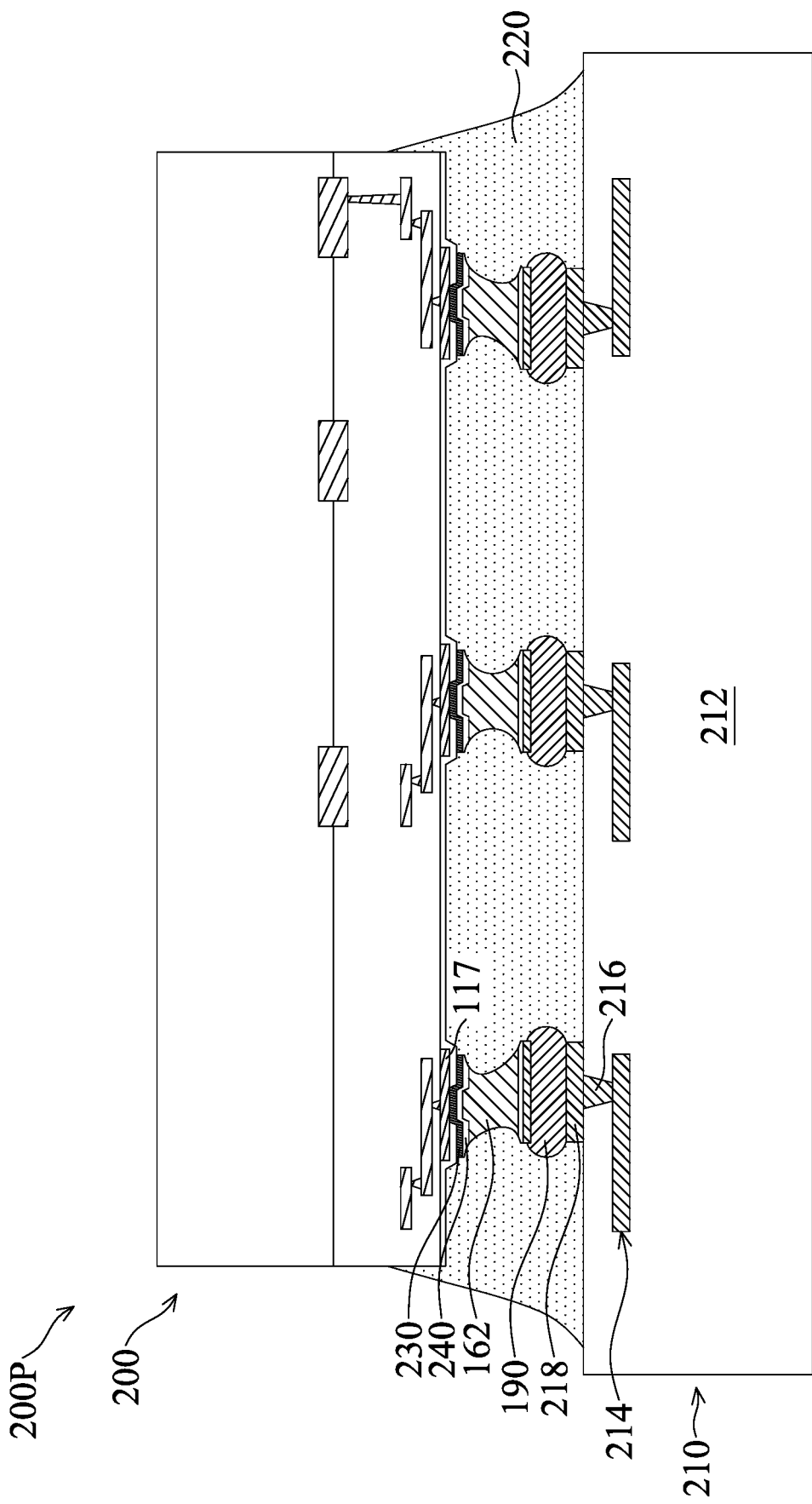

As shown in FIG. 2D, the steps of FIGS. 1D-1F are performed to form chip structures 200, to bond the chip structure 200 to a wiring substrate 210 through the solder structures 190, and to form an underfill layer 220 between the wiring substrate 210 and the chip structure 200, in accordance with some embodiments. In this step, a chip package structure 200P is substantially formed, in accordance with some embodiments.

Figure 3A:
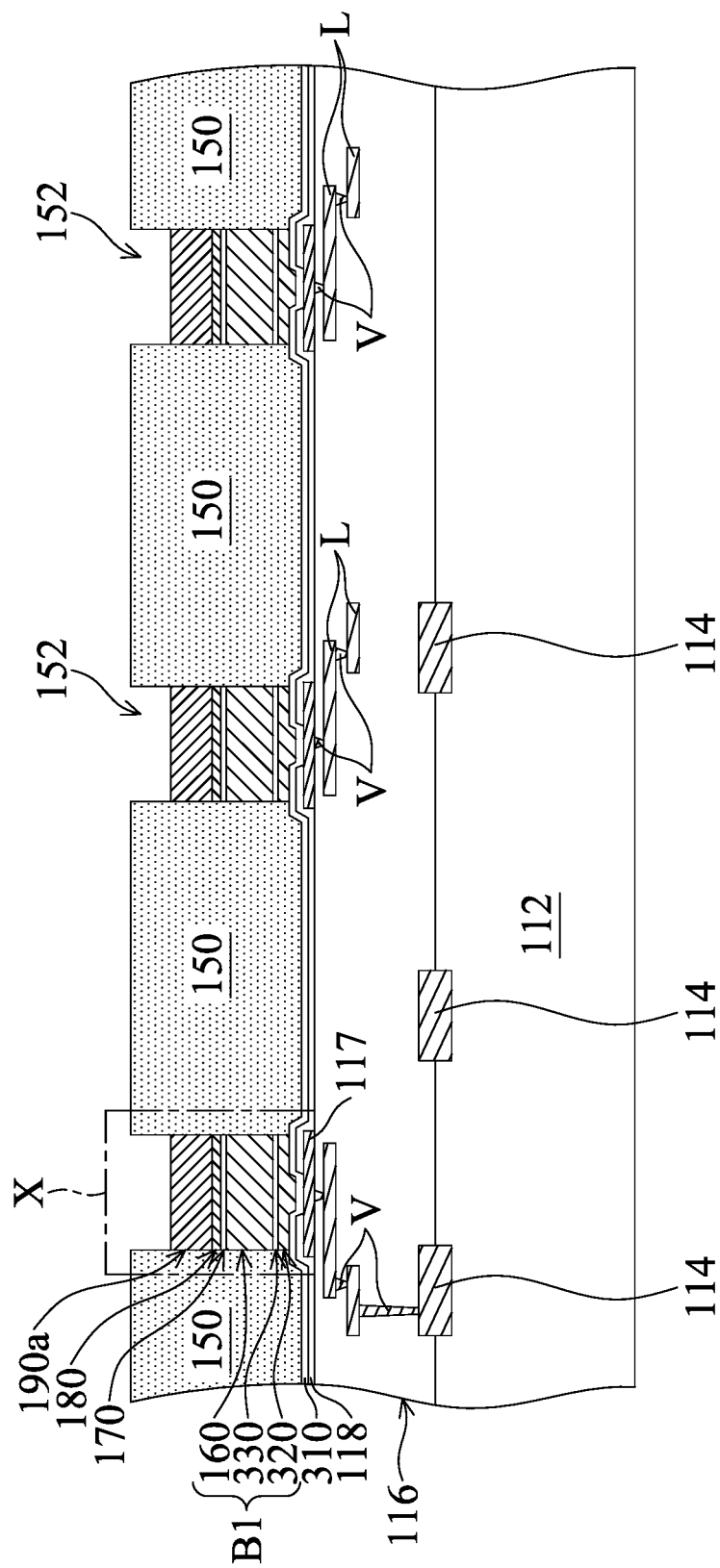
FIGS. 3A-3D are cross-sectional views of various stages of a process for forming a chip package structure, in accordance with some embodiments.
Figures 1, 3A:
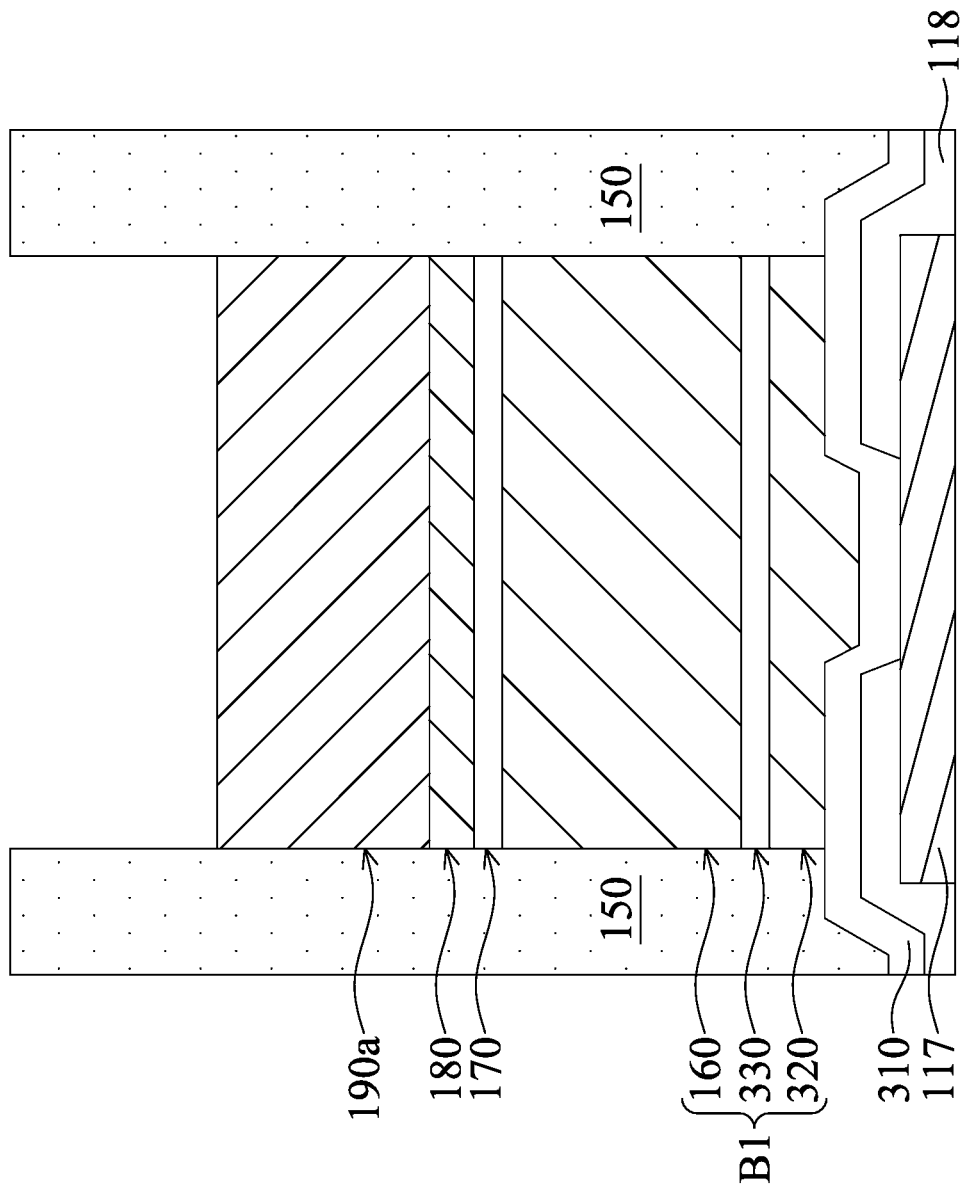

FIGS. 3A-3D are cross-sectional views of various stages of a process for forming a chip package structure, in accordance with some embodiments. FIG. 3A-1 is an enlarged view of a region X of the structure of FIG. 3A, in accordance with some embodiments.

After the formation of the passivation layer 118 of FIG. 1A, as shown in FIGS. 3A and 3A-1, a seed layer 310 is conformally formed over the passivation layer 118 and the conductive pads 117, in accordance with some embodiments. The materials of the seed layer 310 include a metal (e.g., titanium, copper, tungsten, aluminum, or nickel), an alloy thereof, or another suitable material, in accordance with some embodiments. The seed layer 310 is formed using a physical vapor deposition (PVD) process such as a sputtering process, in accordance with some embodiments.

As shown in FIGS. 3A and 3A-1, a mask layer 150 is formed over the seed layer 310, in accordance with some embodiments. The mask layer 150 has openings 152, in accordance with some embodiments. The openings 152 partially expose the seed layer 310 over the conductive pads 117, in accordance with some embodiments.

As shown in FIGS. 3A and 3A-1, a conductive layer 320 is formed in the openings 152, in accordance with some embodiments. The conductive layer 320 is made of a metal (e.g., gold) or an alloy thereof, in accordance with some embodiments. The conductive layer 320 is formed using an electroplating process, in accordance with some embodiments.

As shown in FIGS. 3A and 3A-1, an alloy layer 330 and a conductive layer 160 are sequentially formed in the openings 152, in accordance with some embodiments. The conductive layer 160, the alloy layer 330, and the conductive layer 320 in each opening 152 forms a conductive bump B1, in accordance with some embodiments.

The alloy layer 330 and the conductive layer 160 are formed using an electroplating process, in accordance with some embodiments. In some embodiments, the conductive layer 160 is made of a conductive material such as copper (Cu) or the like, in accordance with some embodiments.

During the electroplating process for forming the alloy layer 330 and the conductive layer 160, the conductive material (e.g., Cu) for forming the conductive layer 160 tends to bond with gold in the conductive layer 320, which forms the alloy layer 330 (e.g., a copper-gold alloy layer) firstly and then forms the conductive layer 160 over the alloy layer 330, in accordance with some embodiments. Therefore, the alloy layer 330 is also referred to as a transition layer between the conductive layer 160 and the conductive layer 320, in accordance with some embodiments.

The alloy layer 330 includes the materials of the conductive layer 160 and the conductive layer 320, in accordance with some embodiments. The composition (e.g., copper) of the conductive layer 160 is different from the composition (e.g., copper and gold) of the alloy layer 330 and the composition (e.g., gold) of the conductive layer 320, in accordance with some embodiments.

As shown in FIGS. 3A and 3A-1, an alloy layer 170, a support layer 180, and a solder layer 190a are sequentially formed over the conductive layer 160 using electroplating processes, in accordance with some embodiments.

Figure 3B:
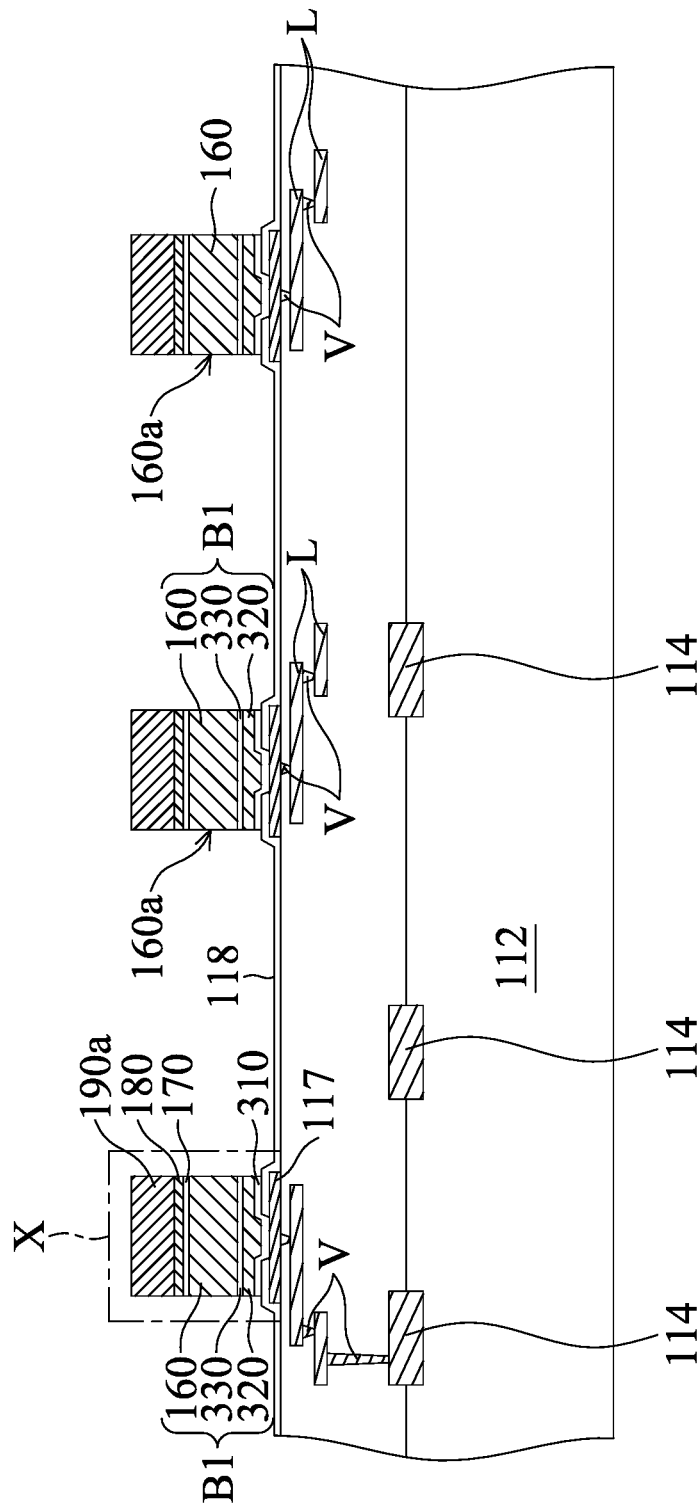
Figures 1, 3B:
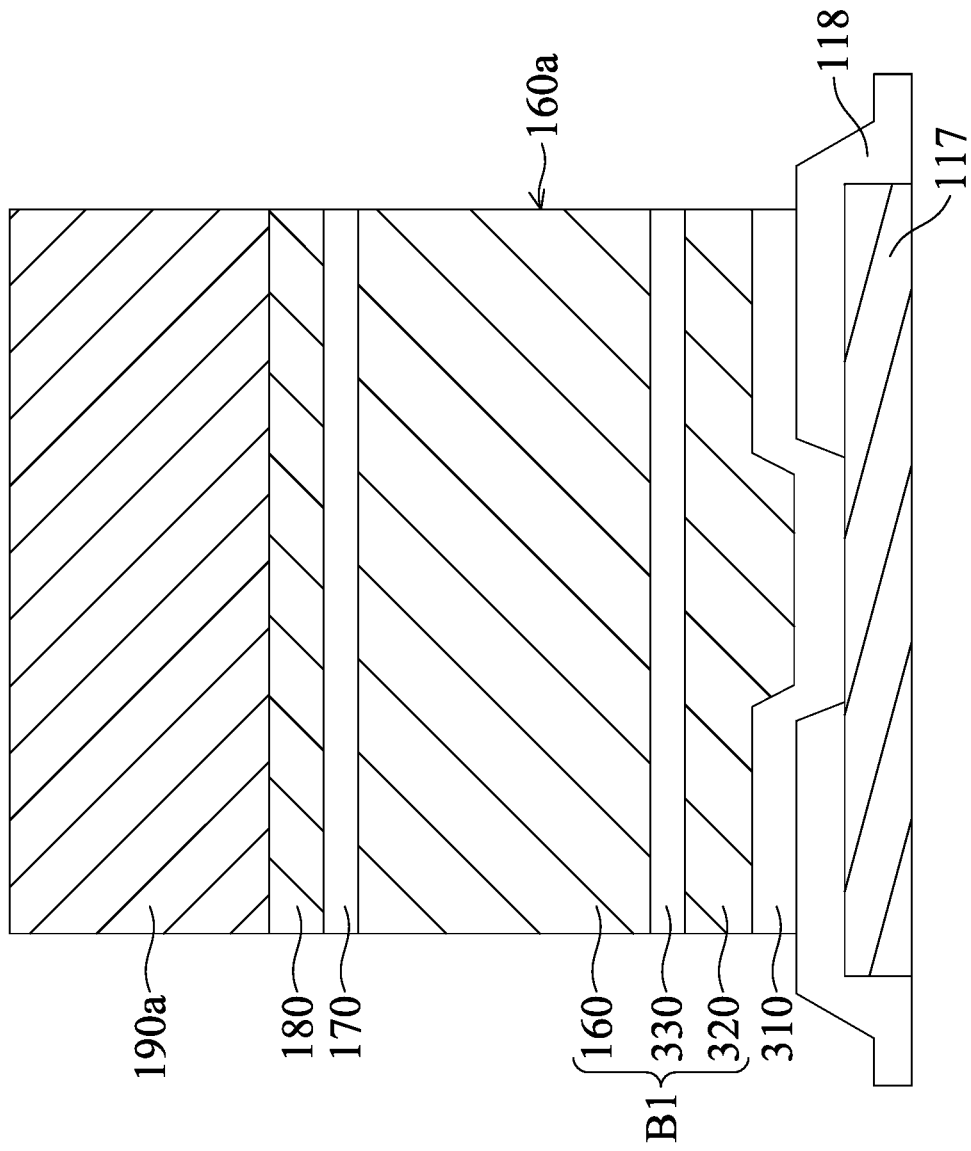

FIG. 3B-1 is an enlarged view of a region X of the structure of FIG. 3B, in accordance with some embodiments. As shown in FIGS. 3B and 3B-1, the mask layer 150 is removed, in accordance with some embodiments. As shown in FIGS. 3B and 3B-1, the seed layer 310 originally under the mask layer 150 is removed, in accordance with some embodiments.

Figure 3C:
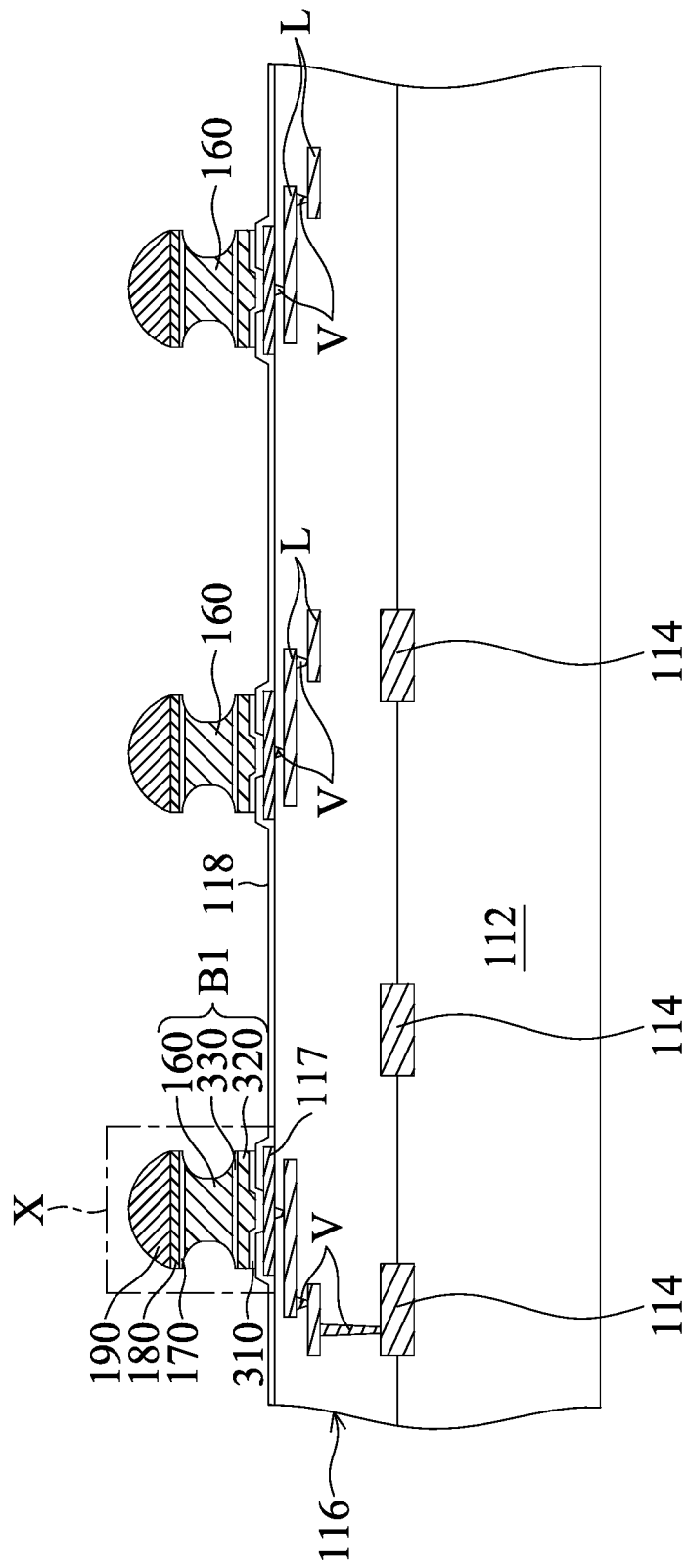
Figures 1, 3C:
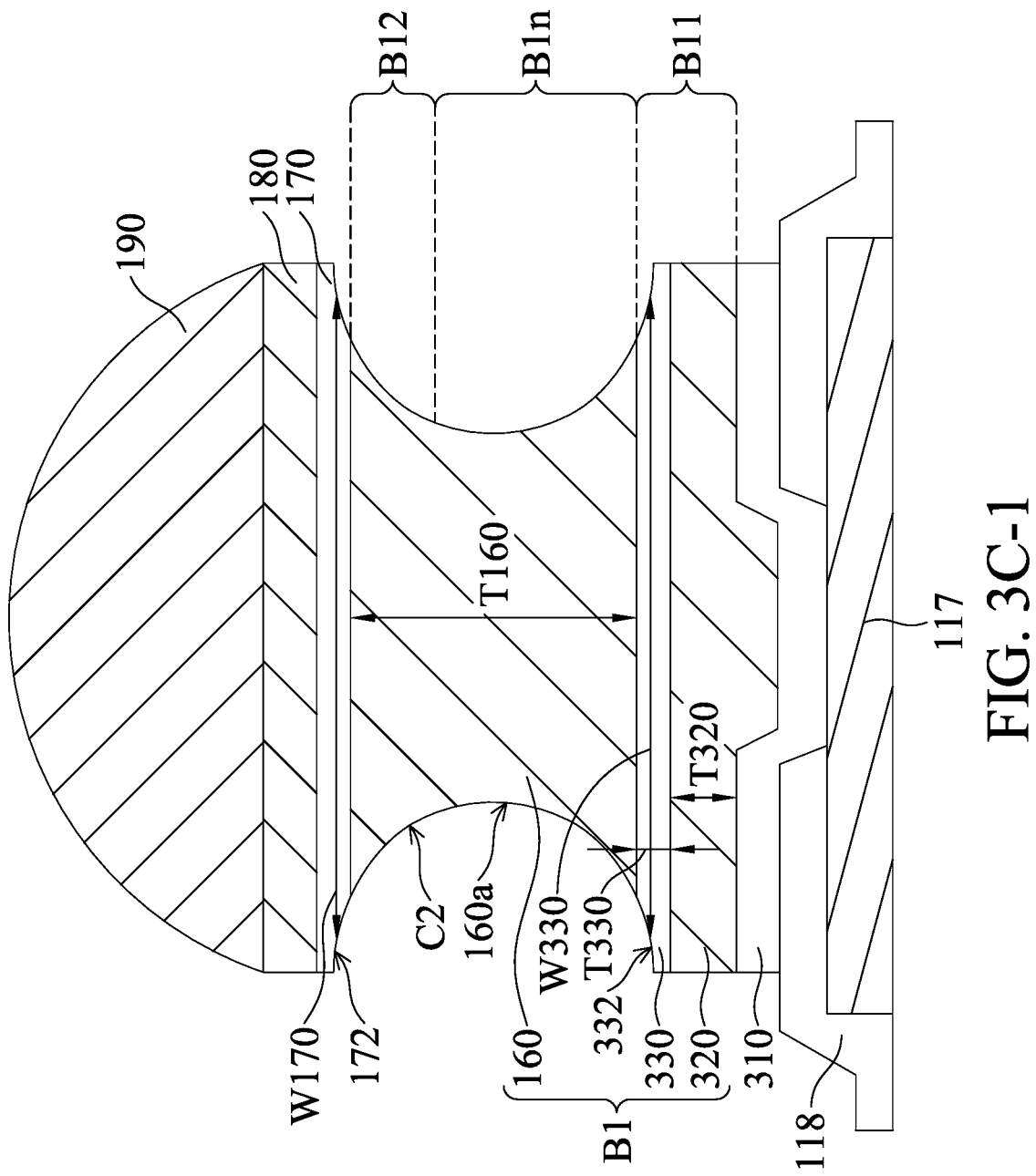

FIG. 3C-1 is an enlarged view of a region X of the structure of FIG. 3C, in accordance with some embodiments. As shown in FIGS. 3B, 3C and 3C-1, a selective etching process is performed to remove portions of the conductive layer 160 from the sidewalls 160a of the conductive layer 160 so as to narrow the conductive layer 160, in accordance with some embodiments. After the selective etching process, the sidewalls 160a become concave sidewalls 160a, in accordance with some embodiments.

Since the alloy layers 170 and 330 have the metal material (e.g., copper) of the conductive bump B1, the selective etching process further removes upper edge portions of the alloy layer 330 and lower edge portions of the alloy layer 170, in accordance with some embodiments. After the selective etching process, the alloy layer 170 has sloped sidewalls 172, and the alloy layer 330 has sloped sidewalls 332, in accordance with some embodiments. The sidewalls 172, 160a, and 332 are sequentially connected to each other, in accordance with some embodiments.

The sidewalls 172, 160a, and 332 are curved sidewalls, in accordance with some embodiments. The sidewalls 172, 160a, and 332 together form a curved sidewall C2, in accordance with some embodiments. The alloy layer 330 surrounded by the sidewalls 332 has a width W330 decreasing toward the conductive layer 160, in accordance with some embodiments. The alloy layer 170 surrounded by the sidewalls 172 has a width W170 decreasing toward the conductive layer 160, in accordance with some embodiments.

The conductive layer 160 is thicker than the alloy layer 330 and the conductive layer 320, in accordance with some embodiments. The thickness T160 of the conductive layer 160 is greater than a sum of the thickness T330 of the alloy layer 330 and the thickness T320 of the conductive layer 320, in accordance with some embodiments. The conductive layer 320 is used to adjust the thickness T160 of the conductive layer 160 and to adjust the profile (e.g., curvature) of the curved sidewall C2, in accordance with some embodiments.

Each conductive bump B1 has a first portion B11, a second portion B12, and a neck portion B1n between the first portion B11 and the second portion B12, in accordance with some embodiments. The composition (e.g., copper) of the neck portion B1n is different from the composition of the first portion B11, in accordance with some embodiments. In the selective etching process, an etching selection ratio (or an etching rate ratio) of the conductive layer 160 to the alloy layer 170 or 330 ranges from about 2 to about 4, in accordance with some embodiments.

As shown in FIG. 3C, a reflow process is performed over the solder layer 190a to convert the solder layer 190a into solder structures 190, in accordance with some embodiments. The solder structures 190 are also referred to as solder balls or solder bumps, in accordance with some embodiments.

Figure 3D:
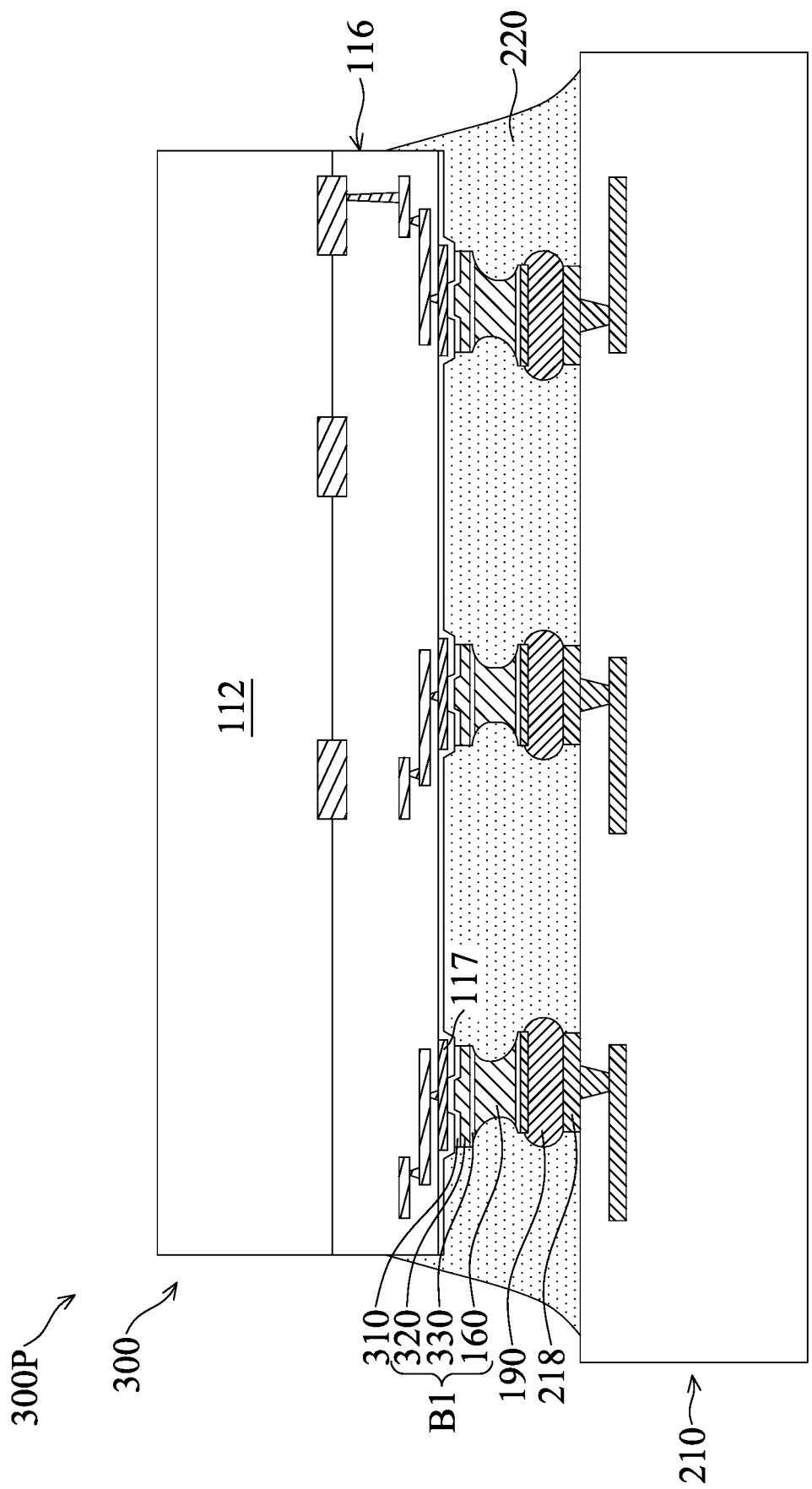

As shown in FIG. 3D, the steps of FIGS. 1D-1F are performed to form chip structures 300, to bond the chip structure 300 to a wiring substrate 210 through the solder structures 190, and to form an underfill layer 220 between the wiring substrate 210 and the chip structure 300, in accordance with some embodiments. In this step, a chip package structure 300P is substantially formed, in accordance with some embodiments.

Figure 4A:
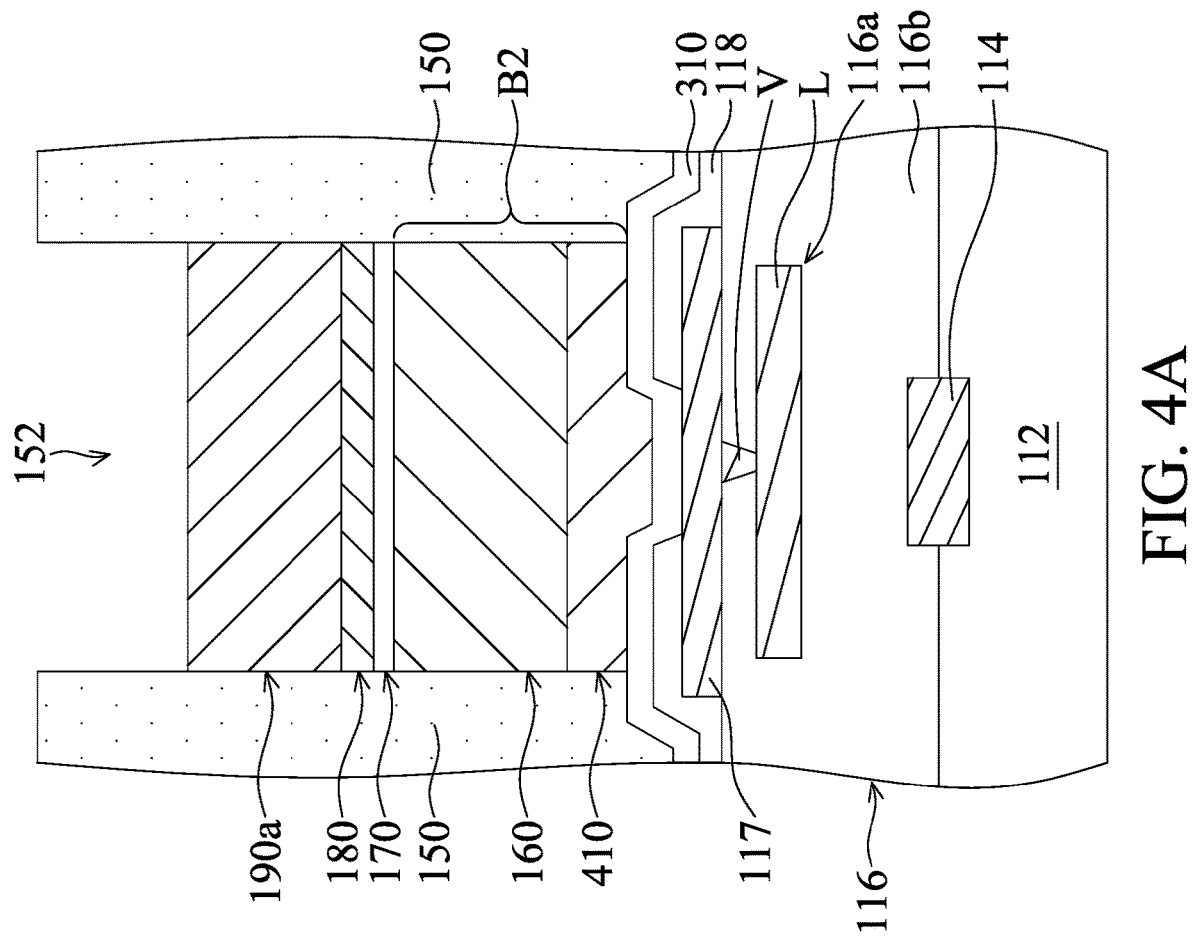
FIGS. 4A-4D are cross-sectional views of various stages of a process for forming a chip package structure, in accordance with some embodiments.

FIGS. 4A-4D are cross-sectional views of various stages of a process for forming a chip package structure, in accordance with some embodiments. After the formation of the seed layer 310 and the mask layer 150 of FIGS. 3A and 3A-1, as shown in FIG. 4A, a conductive layer 410 is formed in the openings 152 of the mask layer 150, in accordance with some embodiments.

For the sake of simplicity, FIG. 4A only shows one of the openings 152 of the mask layer 150. The conductive layer 410 is made of a metal (e.g., copper) or alloys thereof, in accordance with some embodiments. The density of the conductive layer 410 ranges from about 4 g/cm$^3$ to about 12 g/cm$^3$, in accordance with some embodiments. The conductive layer 410 is formed using an electroplating process, in accordance with some embodiments.

As shown in FIG. 4A, a conductive layer 160 is formed in the openings 152, in accordance with some embodiments. The conductive layers 410 and 160 in each opening 152 together form a conductive bump B2, in accordance with some embodiments.

The conductive layer 410 is denser than the conductive layer 160, in accordance with some embodiments. That is, the density of the conductive layer 410 is greater than a density of the conductive layer 160, in accordance with some embodiments. In some embodiments, a ratio of the density difference between the conductive layers 410 and 160 to an average of the densities of the conductive layers 410 and 160 is equal to or greater than 10%. The etching selection ratio of the conductive layer 160 to the conductive layer 410 ranges from about 2 to about 4, in accordance with some embodiments.

If the ratio of the density difference to the average of the densities of the conductive layers 410 and 160 is less than 10%, the etching selection ratio of the conductive layer 160 to the conductive layer 410 is too low to form a neck portion of the conductive bump B2 in a subsequent selective etching process, in accordance with some embodiments.

As shown in FIG. 4A, an alloy layer 170, a support layer 180, and a solder layer 190a are sequentially formed over the conductive layer 160 using electroplating processes, in accordance with some embodiments.

Figure 4B:
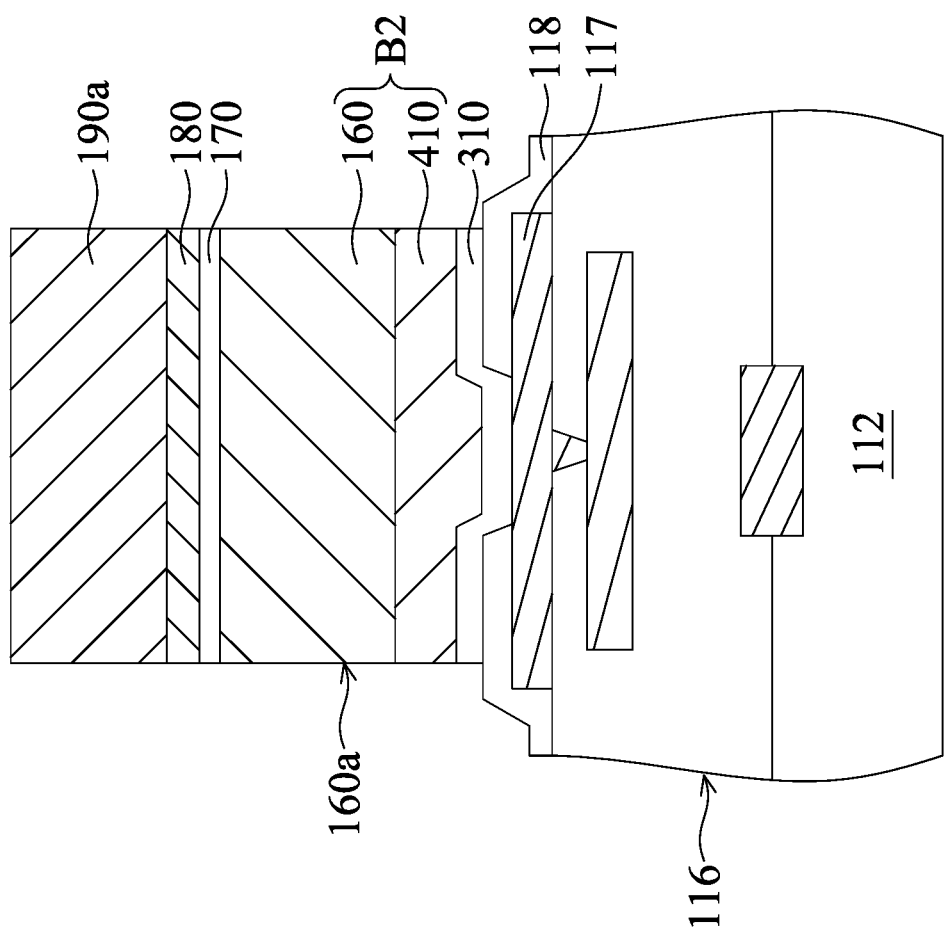

As shown in FIG. 4B, the mask layer 150 is removed, in accordance with some embodiments. As shown in FIG. 4B, the seed layer 310 originally under the mask layer 150 is removed, in accordance with some embodiments.

Figure 4C:
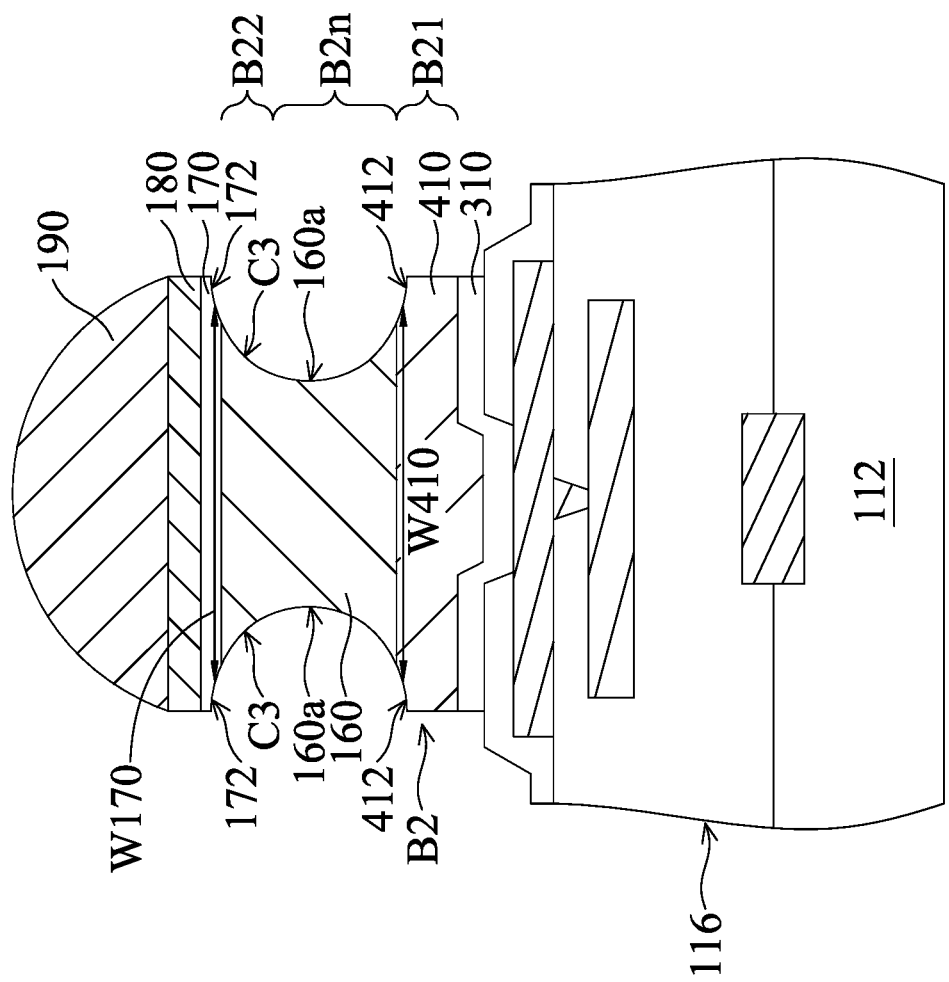

As shown in FIGS. 4B and 4C, a selective etching process is performed to remove portions of the conductive layer 160 from the sidewalls 160a of the conductive layer 160 so as to narrow the conductive layer 160, in accordance with some embodiments. After the selective etching process, the sidewalls 160a become concave sidewalls 160a, in accordance with some embodiments.

Since the alloy layer 170 and the conductive layer 410 have the metal material (e.g., copper) of the conductive layer 160, the selective etching process further removes upper edge portions of the conductive layer 410 and lower edge portions of the alloy layer 170. After the selective etching process, sidewalls 172 of the alloy layer 170 and sidewalls 412 of the conductive layer 410 are sloped sidewalls, in accordance with some embodiments. The sidewalls 172, 160a, and 412 are sequentially connected to each other, in accordance with some embodiments.

The sidewalls 172, 160a, and 412 are curved sidewalls, in accordance with some embodiments. The sidewalls 172, 160a, and 412 together form a curved sidewall C3, in accordance with some embodiments. The conductive layer 410 surrounded by the sidewalls 412 has a width W410 decreasing toward the conductive layer 160, in accordance with some embodiments. The alloy layer 170 surrounded by the sidewalls 172 has a width W170 decreasing toward the conductive layer 160, in accordance with some embodiments.

The conductive bump B2 has a first portion B21, a second portion B22, and a neck portion B2n between the first portion B21 and the second portion B22, in accordance with some embodiments. The density of the first portion B21 is greater than the density of the neck portion B2n, in accordance with some embodiments. In the selective etching process, an etching selection ratio (or an etching rate ratio) of the conductive layer 160 to the alloy layer 170 or the conductive layer 410 ranges from about 2 to about 4, in accordance with some embodiments.

As shown in FIG. 4C, a reflow process is performed over the solder layer 190a to convert the solder layer 190a into solder structures 190, in accordance with some embodiments. The solder structures 190 are also referred to as solder balls or solder bumps, in accordance with some embodiments.

Figure 4D:
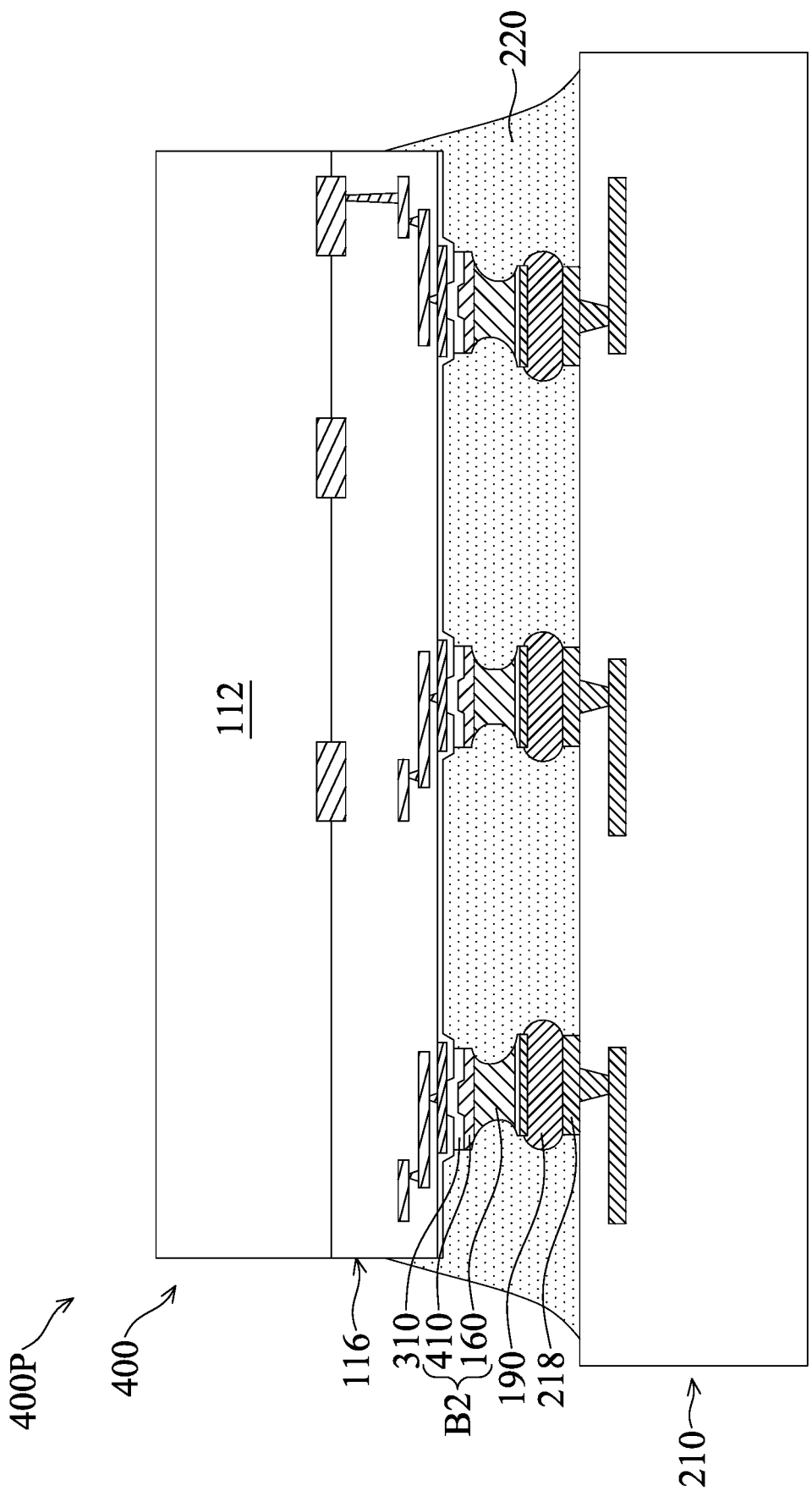

As shown in FIG. 4D, the steps of FIGS. 1D-1F are performed to form chip structures 400, to bond the chip structure 400 to a wiring substrate 210 through the solder structures 190, and to form an underfill layer 220 between the wiring substrate 210 and the chip structure 400, in accordance with some embodiments. In this step, a chip package structure 400P is substantially formed, in accordance with some embodiments.

Figure 5A:
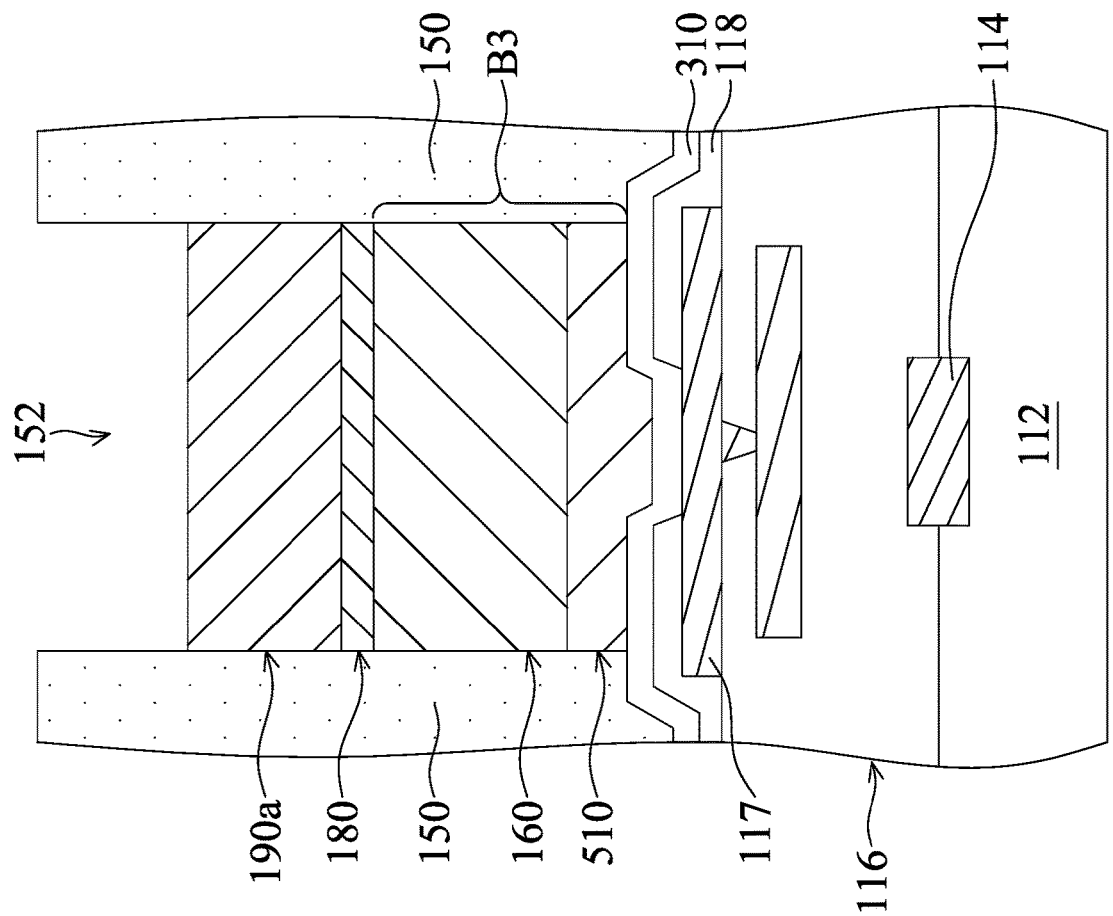
FIGS. 5A-5D are cross-sectional views of various stages of a process for forming a chip package structure, in accordance with some embodiments.

FIGS. 5A-5D are cross-sectional views of various stages of a process for forming a chip package structure, in accordance with some embodiments. After the formation of the seed layer 310 and the mask layer 150 of FIGS. 3A and 3A-1, as shown in FIG. 5A, a conductive layer 510 is formed in the openings 152 of the mask layer 150, in accordance with some embodiments. For the sake of simplicity, FIG. 5A only shows one of the openings 152 of the mask layer 150.

As shown in FIG. 5A, a conductive layer 160 is formed in the openings 152, in accordance with some embodiments. The conductive layers 510 and 160 in each opening 152 together form a conductive bump B3, in accordance with some embodiments.

The conductive layer 160 is made of a metal (e.g., copper), and the conductive layer 510 is made of an alloy containing the metal (e.g., a copper alloy), in accordance with some embodiments. The copper alloy includes a copper-aluminum alloy, a copper-tin alloy, a copper-nickel alloy, or the like, in accordance with some embodiments. The conductive layers 160 and 510 are formed using electroplating processes, in accordance with some embodiments.

As shown in FIG. 5A, a support layer 180 and a solder layer 190a are sequentially formed over the conductive layer 160 using electroplating processes, in accordance with some embodiments. The support layer 180 is made of an alloy containing the metal in the conductive layer 160 (e.g., a copper alloy), in accordance with some embodiments. The copper alloy includes a copper-aluminum alloy, a copper-tin alloy, a copper-nickel alloy, or the like, in accordance with some embodiments.

Figure 5B:
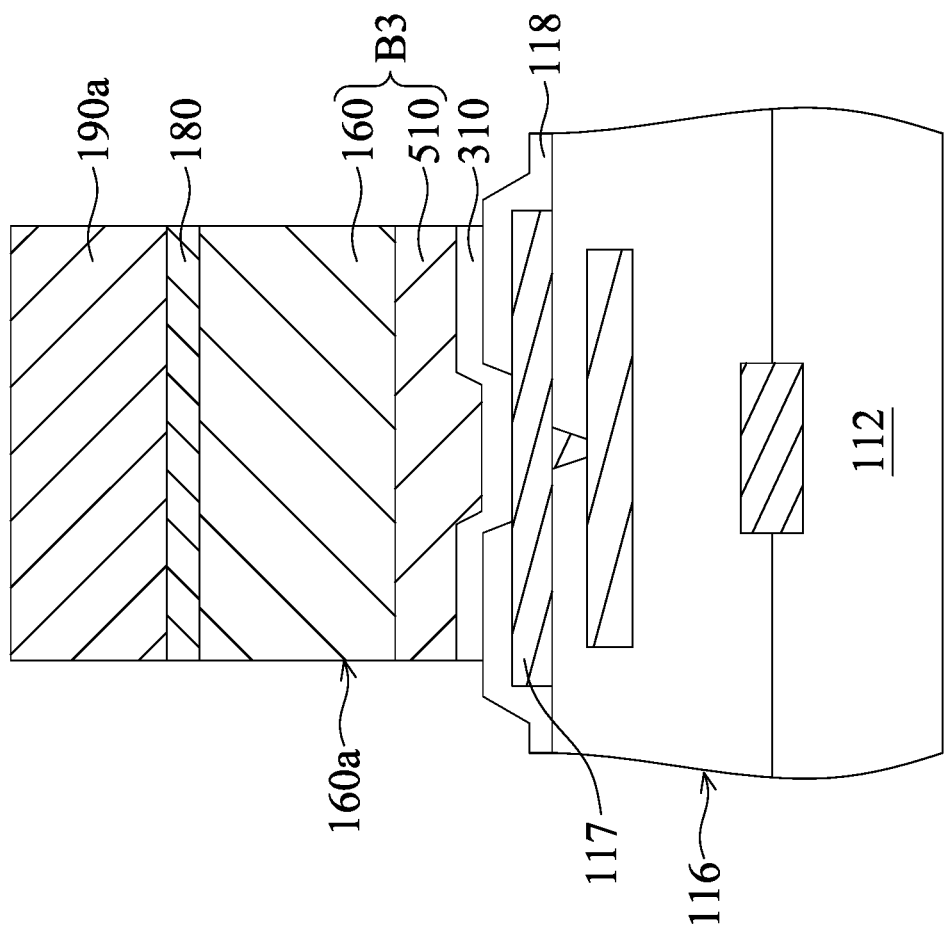

As shown in FIG. 5B, the mask layer 150 is removed, in accordance with some embodiments. As shown in FIG. 5B, the seed layer 310 originally under the mask layer 150 is removed, in accordance with some embodiments.

Figure 5C:
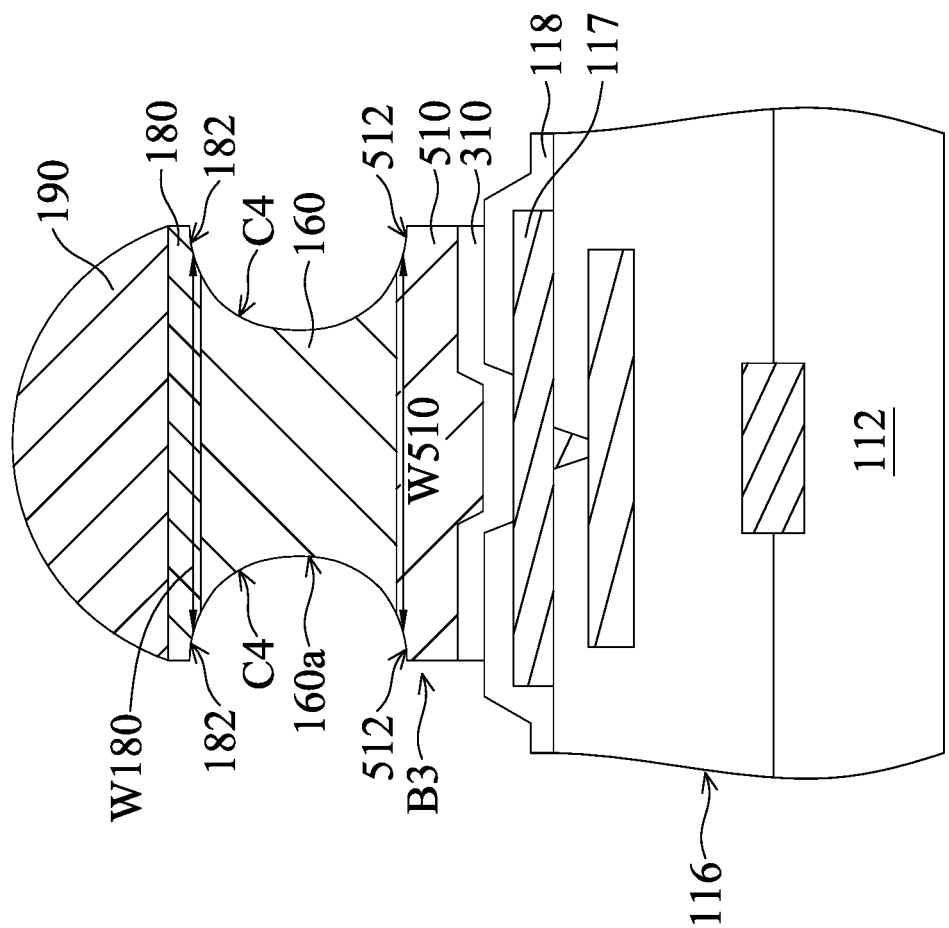

As shown in FIGS. 5B and 5C, a selective etching process is performed to remove portions of the conductive layer 160 from the sidewalls 160a of the conductive layer 160 so as to narrow the conductive layer 160, in accordance with some embodiments. After the selective etching process, the sidewalls 160a become concave sidewalls 160a, in accordance with some embodiments.

Since the support layer 180 and the conductive layer 510 have the metal material (e.g., copper) of the conductive layer 160, the selective etching process further removes upper edge portions of the conductive layer 510 and lower edge portions of the support layer 180.

After the selective etching process, sidewalls 182 of the support layer 180 and sidewalls 512 of the conductive layer 510 are sloped sidewalls, in accordance with some embodiments. The sidewalls 182, 160a, and 512 are sequentially connected to each other, in accordance with some embodiments. The sidewalls 182, 160a, and 512 are curved sidewalls, in accordance with some embodiments. The sidewalls 182, 160a, and 512 together form a curved sidewall C4, in accordance with some embodiments.

The conductive layer 510 surrounded by the sidewalls 512 has a width W510 decreasing toward the conductive layer 160, in accordance with some embodiments. The support layer 180 surrounded by the sidewalls 182 has a width W180 decreasing toward the conductive layer 160, in accordance with some embodiments. In the selective etching process, an etching selection ratio (or an etching rate ratio) of the conductive layer 160 to the support layer 180 or the conductive layer 510 ranges from about 2 to about 4, in accordance with some embodiments.

As shown in FIG. 5C, a reflow process is performed over the solder layer 190a to convert the solder layer 190a into solder structures 190, in accordance with some embodiments. The solder structures 190 are also referred to as solder balls or solder bumps, in accordance with some embodiments.

Figure 5D:
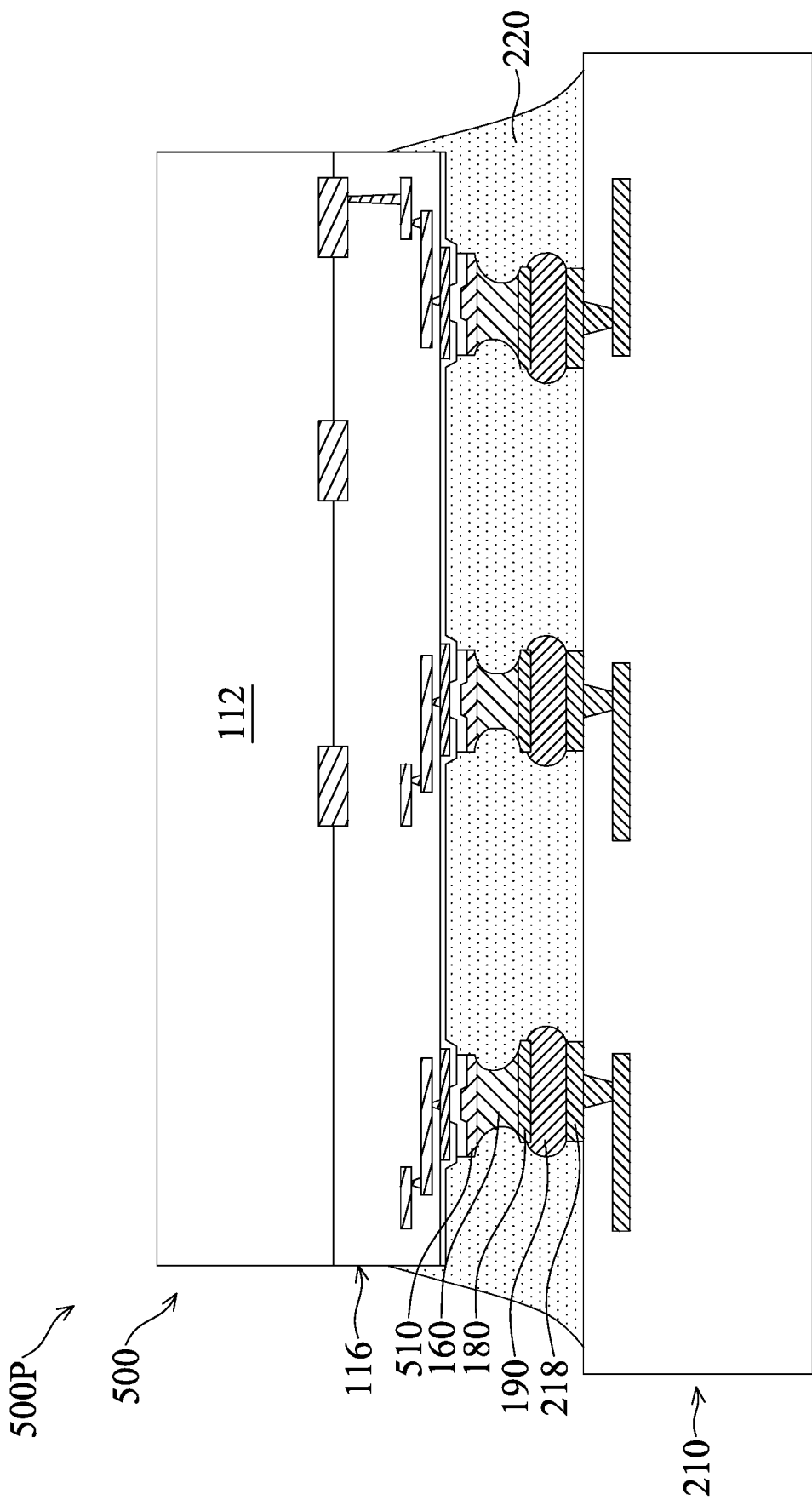

As shown in FIG. 5D, the steps of FIGS. 1D-1F are performed to form chip structures 500, to bond the chip structure 500 to a wiring substrate 210 through the solder structures 190, and to form an underfill layer 220 between the wiring substrate 210 and the chip structure 500, in accordance with some embodiments. In this step, a chip package structure 500P is substantially formed, in accordance with some embodiments.

Processes and materials for forming the chip package structures 200P, 300P, 400P, and 500P may be similar to, or the same as, those for forming the chip package structure 100P described above.

In accordance with some embodiments, chip structures and methods for forming the same are provided. The methods (for forming the chip structure and the chip package structure) form conductive bumps with neck portions to reduce the strength of the conductive bumps against deformation or to reduce a spring constant of the conductive bumps. Therefore, the joint stress caused by the CTE mismatch between a wiring substrate and the chip structure, which is bonded to the wiring substrate through the conductive bumps, is reduced. As a result, the reliability of the conductive bumps is improved.

In accordance with some embodiments, a chip structure is provided. The chip structure includes a substrate. The chip structure includes an interconnect layer over the substrate. The chip structure includes a conductive pad over the interconnect layer. The chip structure includes a conductive bump over the conductive pad. The conductive bump has a first portion, a second portion, and a neck portion between the first portion and the second portion. The first portion is between the neck portion and the conductive pad. The neck portion is narrower than the first portion and narrower than the second portion.

In accordance with some embodiments, a chip package structure is provided. The chip package structure includes a wiring substrate. The chip package structure includes a chip structure over the wiring substrate. The chip structure includes a substrate, an interconnect layer under the substrate, a first conductive pad under the interconnect layer, and a conductive bump connected between the first conductive pad and the wiring substrate. The conductive bump has a first portion, a second portion, and a neck portion between the first portion and the second portion, a first width of the first portion decreases toward the neck portion, and a second width of the second portion decreases toward the neck portion.

In accordance with some embodiments, a method for forming a chip structure is provided. The method includes providing a substrate, an interconnect layer, and a conductive pad. The interconnect layer is over the substrate, and the conductive pad is over the interconnect layer. The method includes forming a conductive structure over the conductive pad. The conductive structure comprises a first conductive layer, a second conductive layer, and a third conductive layer, the first conductive layer is between the conductive pad and the second conductive layer, the second conductive layer is between the first conductive layer and the third conductive layer, a first composition of the second conductive layer is different from a second composition of the first conductive layer and a third composition of the third conductive layer, and the second conductive layer is thicker than the first conductive layer and the third conductive layer. The method includes partially removing the second conductive layer. The second conductive layer has a concave sidewall after partially removing the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
   a substrate;
   an interconnect layer over the substrate;
   a conductive pad over the interconnect layer;
   a conductive bump over the conductive pad, wherein the conductive bump has a first portion, a second portion, and a neck portion between the first portion and the second portion, the first portion is between the neck portion and the conductive pad, and the neck portion is narrower than the first portion and narrower than the second portion; and
   an alloy layer between the conductive bump and the conductive pad, wherein a first composition of the alloy layer is different from a second composition of the conductive bump, and the alloy layer has a first width decreasing toward the conductive bump.

2. The chip structure as claimed in claim 1, wherein the alloy layer and the conductive bump have a same metal element.

3. The chip structure as claimed in claim 1, further comprising:
   a first seed layer between the alloy layer and the conductive pad, wherein the first seed layer and the alloy layer have a same first metal element.

4. The chip structure as claimed in claim 3, further comprising:
   a second seed layer between the alloy layer and the conductive bump, wherein the second seed layer and the alloy layer have a same second metal element.

5. The chip structure as claimed in claim 3, wherein the alloy layer conformally covers the first seed layer.

6. The chip structure as claimed in claim 4, wherein the second seed layer conformally covers the alloy layer.

7. The chip structure as claimed in claim 3, wherein the second seed layer has a second width decreasing toward the conductive bump.

8. The chip structure as claimed in claim 1, wherein a first density of the first portion is greater than a second density of the neck portion.

9. The chip structure as claimed in claim 1, further comprising:
   a support layer over the second portion of the conductive bump, wherein a first composition of the support layer is different from a second composition of the conductive bump, and the support layer is wider than the neck portion of the conductive bump; and
   a solder structure over the support layer.

10. The chip structure as claimed in claim 9, further comprising:
    an alloy layer between the support layer and the conductive bump.

11. The chip structure as claimed in claim 1, wherein a first composition of the neck portion is different from a second composition of the first portion.

12. A chip package structure, comprising:
    a wiring substrate; and
    a chip structure over the wiring substrate, wherein the chip structure comprises:
    a substrate;
    an interconnect layer under the substrate;
    a first conductive pad under the interconnect layer; and
    a conductive bump connected between the first conductive pad and the wiring substrate, and the conductive bump has a first portion, a second portion, and a neck portion between the first portion and the second portion, a first width of the first portion decreases toward the neck portion, a second width of the second portion decreases toward the neck portion,
    the wiring substrate comprises a second conductive pad, the conductive bump is connected between the first conductive pad and the second conductive pad, and a first center portion of the first conductive pad is misaligned with a second center portion of the second conductive pad relative to an axis perpendicular to a surface of the substrate, and the interconnect layer is under the surface.

13. The chip package structure as claimed in claim 12, wherein the neck portion is narrower than the first portion and narrower than the second portion.

14. A method for forming a chip structure, comprising:
    providing a substrate, an interconnect layer, and a conductive pad, wherein the interconnect layer is over the substrate, and the conductive pad is over the interconnect layer;
    forming a conductive structure over the conductive pad, wherein the conductive structure comprises a first conductive layer, a second conductive layer, and a third conductive layer, the first conductive layer is between the conductive pad and the second conductive layer, the second conductive layer is between the first conductive layer and the third conductive layer, a first composition of the second conductive layer is different from a second composition of the first conductive layer and a third composition of the third conductive layer, and the second conductive layer is thicker than the first conductive layer and the third conductive layer; and
    partially removing the second conductive layer, wherein the second conductive layer has a concave sidewall after partially removing the second conductive layer.

15. The method for forming the chip structure as claimed in claim 14, wherein a first thickness of the second conductive layer is greater than a sum of a second thickness of the first conductive layer and a third thickness of the third conductive layer.

16. The method for forming the chip structure as claimed in claim 14, wherein the partially removing of the second conductive layer further comprises:
    removing an upper edge portion of the first conductive layer.

17. The method for forming the chip structure as claimed in claim 16, wherein the partially removing of the second conductive layer further comprises:
    removing a lower edge portion of the third conductive layer.

18. The method for forming the chip structure as claimed in claim 14, further comprising:
    forming a seed layer over the conductive pad before forming the conductive structure over the conductive pad, wherein the conductive structure is formed over the seed layer, and the first conductive layer of the conductive structure conformally covers the seed layer.

19. The method for forming the chip structure as claimed in claim 14, wherein the third conductive layer is an alloy layer.

20. The method for forming the chip structure as claimed in claim 14, further comprising:

forming a solder layer over the third conductive layer of the conductive structure before partially removing the second conductive layer.

\* \* \* \* \*